US012787873B2

(12) United States Patent
Sakai et al.

(10) Patent No.: US 12,787,873 B2
(45) Date of Patent: Nov. 3, 2026

(54) SEMICONDUCTOR DEVICE

(71) Applicant: ROHM CO., LTD., Kyoto (JP)

(72) Inventors: Hiroto Sakai, Kyoto (JP); Yuta Okawauchi, Kyoto (JP); Takukazu Otsuka, Kyoto (JP); Ken Nakahara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 560 days.

(21) Appl. No.: 18/252,980

(22) PCT Filed: Nov. 12, 2021

(86) PCT No.: PCT/JP2021/041692
§ 371 (c)(1),
(2) Date: May 15, 2023

(87) PCT Pub. No.: WO2022/118633
PCT Pub. Date: Jun. 9, 2022

(65) Prior Publication Data

US 2024/0014193 A1 Jan. 11, 2024

(30) Foreign Application Priority Data

Dec. 3, 2020 (JP) ................................ 2020-200924

(51) Int. Cl.
*H10W 74/10* (2026.01)
*H10W 70/65* (2026.01)
(Continued)

(52) U.S. Cl.
CPC ........... *H10W 90/00* (2026.01); *H10W 70/65* (2026.01); *H10W 70/60* (2026.01);
(Continued)

(58) Field of Classification Search
CPC ....... H01L 24/32; H01L 24/40; H01L 25/115; H01L 25/072; H01L 23/3107; H10W 72/871; H10W 44/601; H10W 74/111
See application file for complete search history.

(56) References Cited

U.S. PATENT DOCUMENTS

2020/0135702 A1* 4/2020 Arai ........................ H01L 25/18

FOREIGN PATENT DOCUMENTS

JP 2009-158787 7/2009
JP 2011036016 A * 2/2011 ............ H01L 24/40
(Continued)

OTHER PUBLICATIONS

Office Action issued in corresponding Japanese Patent application No. 2022-566816, Aug. 5, 2025, and machine translation (8 pages).
(Continued)

*Primary Examiner* — Michele Fan
(74) *Attorney, Agent, or Firm* — HSML P.C.

(57) ABSTRACT

A semiconductor device includes: a substrate having an obverse surface; a first wiring layer on the obverse surface; a second wiring layer on the obverse surface, separated from the first wiring layer; a first semiconductor element having mutually opposite first obverse electrode and first reverse electrode, with the first reverse electrode bonded to the first wiring layer; a second semiconductor element having mutually opposite second obverse electrode and second reverse electrode, with the second reverse electrode bonded to the second wiring layer; and a conductive member separated from the substrate and bonded to the first and the second obverse electrodes. The first obverse electrode and the second obverse electrode have different polarities. The substrate includes an exposed portion between the first wiring
(Continued)

layer and the second wiring layer. The conductive member overlaps with the exposed portion as viewed in the thickness direction of the substrate.

13 Claims, 21 Drawing Sheets

(51) Int. Cl.

| | |
|---|---|
| ***H10W 90/00*** | (2026.01) |
| *H10W 70/60* | (2026.01) |
| *H10W 72/00* | (2026.01) |
| *H10W 72/30* | (2026.01) |
| *H10W 72/50* | (2026.01) |
| *H10W 72/60* | (2026.01) |
| *H10W 72/90* | (2026.01) |

(52) U.S. Cl.
CPC ...... *H10W 72/352* (2026.01); *H10W 72/5445* (2026.01); *H10W 72/5522* (2026.01); *H10W 72/5524* (2026.01); *H10W 72/5525* (2026.01); *H10W 72/634* (2026.01); *H10W 72/646* (2026.01); *H10W 72/647* (2026.01); *H10W 72/652* (2026.01); *H10W 72/871* (2026.01); *H10W 72/884* (2026.01); *H10W 72/886* (2026.01); *H10W 72/923* (2026.01); *H10W 72/926* (2026.01); *H10W 72/932* (2026.01); *H10W 72/936* (2026.01); *H10W 72/9413* (2026.01); *H10W 72/944* (2026.01); *H10W 72/952* (2026.01); *H10W 90/734* (2026.01); *H10W 90/754* (2026.01); *H10W 90/763* (2026.01)

(56) References Cited

FOREIGN PATENT DOCUMENTS

| | | |
|---|---|---|
| JP | 2013-008757 | 1/2013 |
| WO | 2016-084241 | 6/2016 |

OTHER PUBLICATIONS

International Search Report issued in International Application No. PCT/JP2021/041692, Jan. 25, 2022, 2 pages.

* cited by examiner

SEMICONDUCTOR DEVICE

TECHNICAL FIELD

The present disclosure relates to a semiconductor device, and in particular, to a semiconductor device with a plurality of semiconductor elements.

BACKGROUND ART

Conventionally, semiconductor devices with a plurality of semiconductor elements (such as MOSFETs or IGBTs) having switching functions are widely known and mainly used for power conversion. An example of such a semiconductor device is disclosed in Patent Document 1. In the semiconductor device disclosed in the above document, two wiring layers (metal patterns 4*a*, 4*b*) and three conductor relay regions are disposed on the obverse surface of an insulating substrate. The wiring layers and the conductor relay regions form conduction paths of the semiconductor device. A heat sink is attached to the reverse surface of the insulating substrate via a third metal pattern.

The above-described conventional semiconductor device has a parasitic capacitance between a particular conductor relay region and the heat sink. When voltage change is significant in the conductor relay region, leakage current from the heat sink may occur. When the leakage current is large, there is concern about the adverse effects of noise on the area near the semiconductor device. Thus, it is desired to provide measures to reduce leakage current from a semiconductor device.

PRIOR ART DOCUMENT

Patent Document

Patent Document 1: JP-A-2009-158787

SUMMARY OF THE INVENTION

Problem to be Solved by the Invention

In light of the above circumstances, an object of the present disclosure is to provide a semiconductor device capable of reducing noise due to leakage current.

Means to Solve the Problem

A semiconductor device provided according to the present disclosure includes: a substrate having an obverse surface facing in a thickness direction; a first wiring layer disposed on the obverse surface; a second wiring layer disposed on the obverse surface and spaced apart from the first wiring layer in a first direction orthogonal to the thickness direction; a first semiconductor element having a first obverse electrode and a first reverse electrode located opposite to each other in the thickness direction, the first reverse electrode being bonded to the first wiring layer; a second semiconductor element having a second obverse electrode and a second reverse electrode located opposite to each other in the thickness direction, the second reverse electrode being bonded to the second wiring layer; and a conductive member spaced apart from the substrate in the thickness direction and bonded to the first obverse electrode and the second obverse electrode. Polarities of the first obverse electrode and the second obverse electrode are different from each other. The substrate includes an exposed portion located between the first wiring layer and the second wiring layer. The conductive member overlaps with the exposed portion, as viewed in the thickness direction.

Advantages of the Invention

With the above-configuration, noise due to leakage current in the semiconductor device can be reduced.

Other features and advantages of the present disclosure will become apparent from the detailed description given below with reference to the accompanying drawings.

BRIEF DESCRIPTION OF OT THE DRAWINGS

Mode for carrying out the present disclosure are described below with reference to the accompanying drawings.

Figure 1:
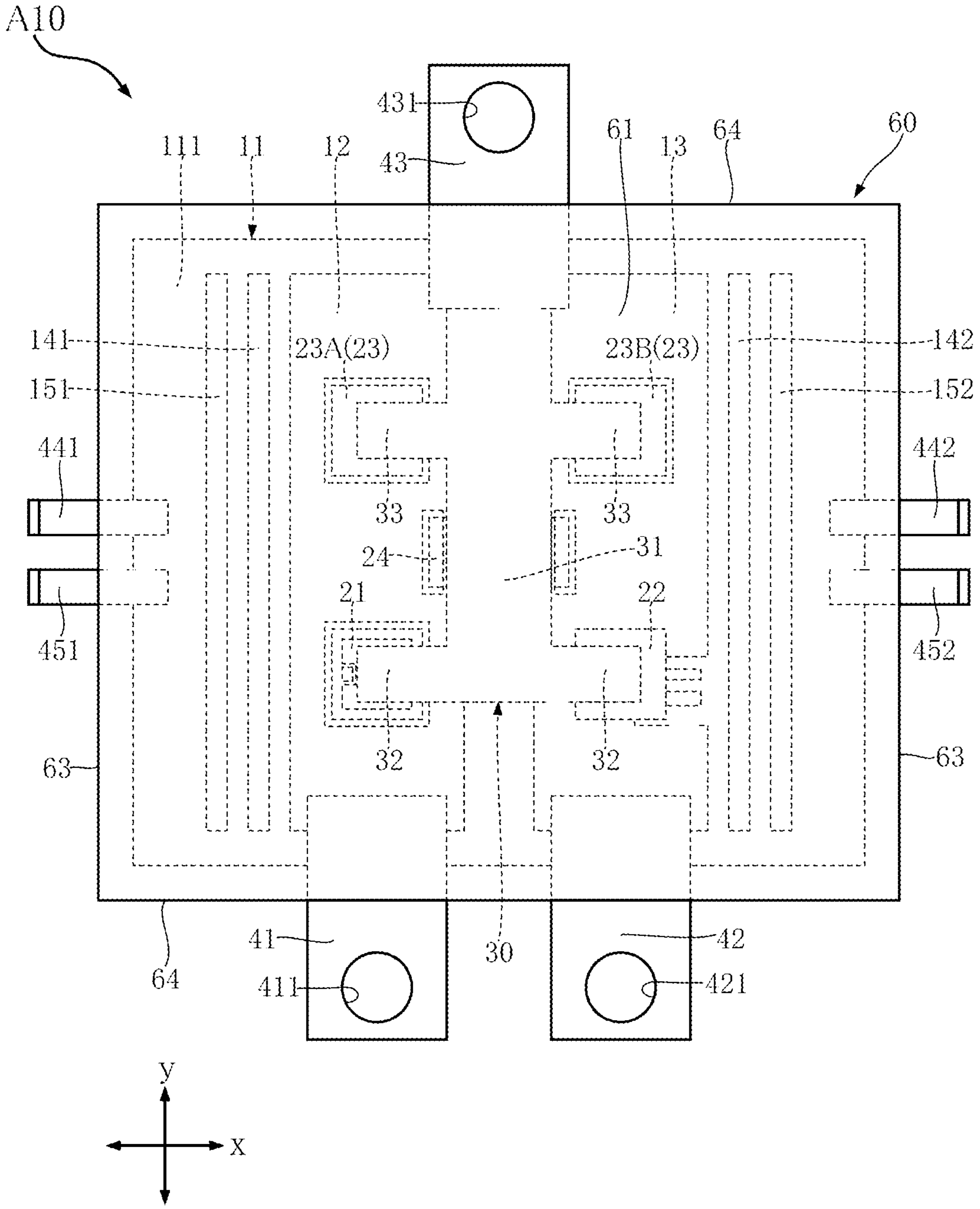
FIG. 1 is a plan view of a semiconductor device according to a first embodiment.
Figure 2:
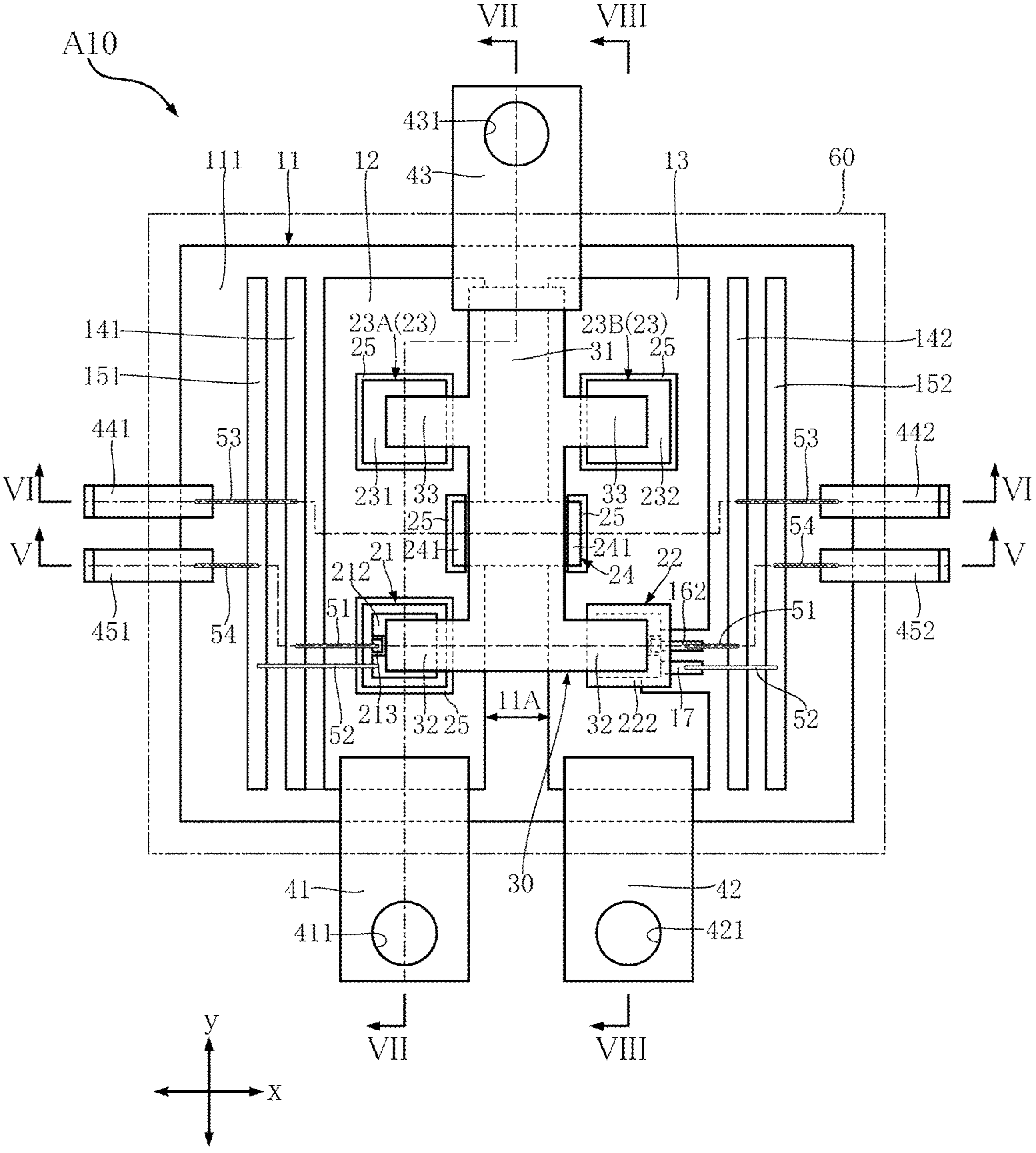
FIG. 2 is a plan view corresponding to FIG. 1 and seen through a sealing resin.
Figure 3:
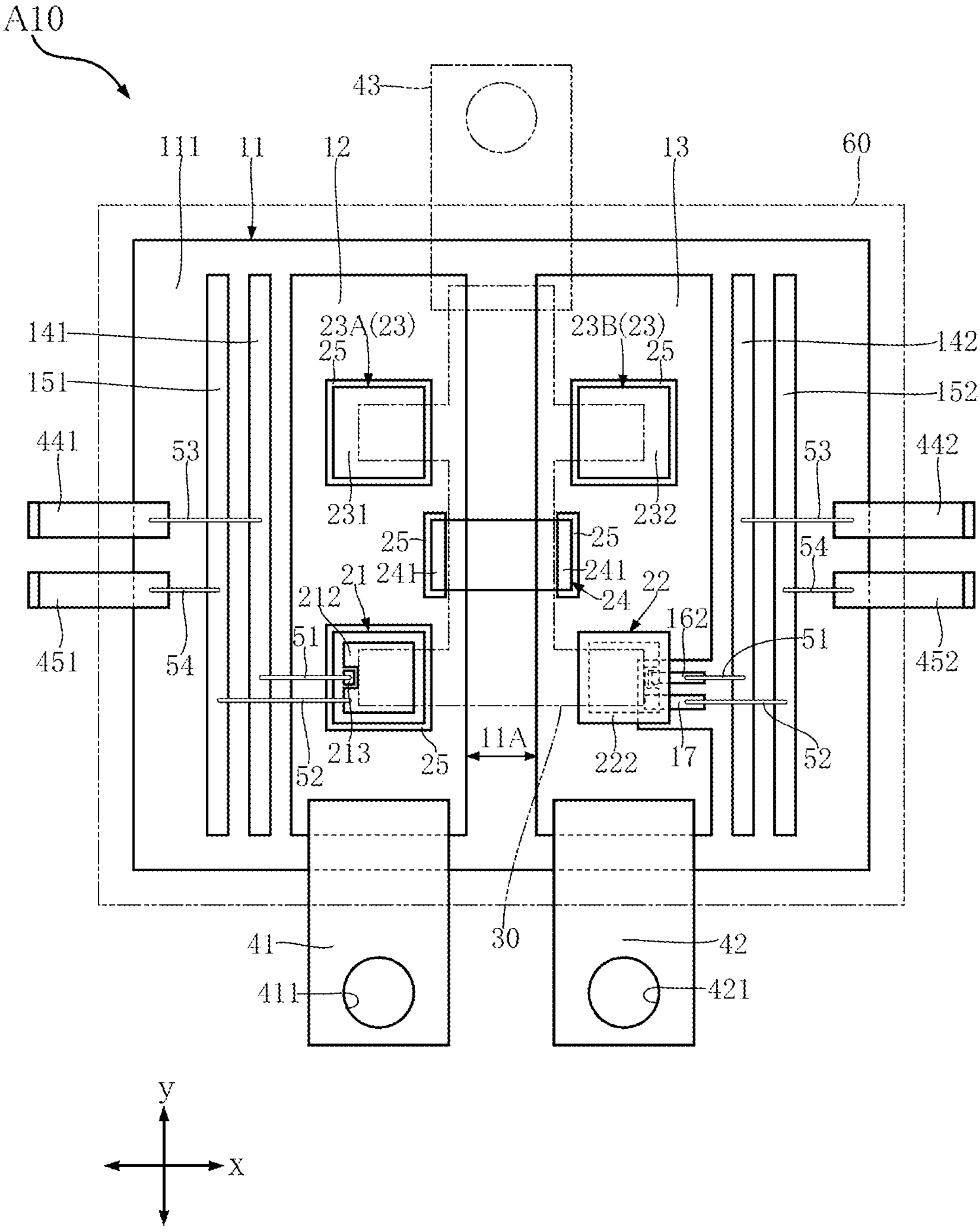
FIG. 3 is a plan view corresponding to FIG. 2 and seen through a conductive member and an output terminal.
Figure 4:
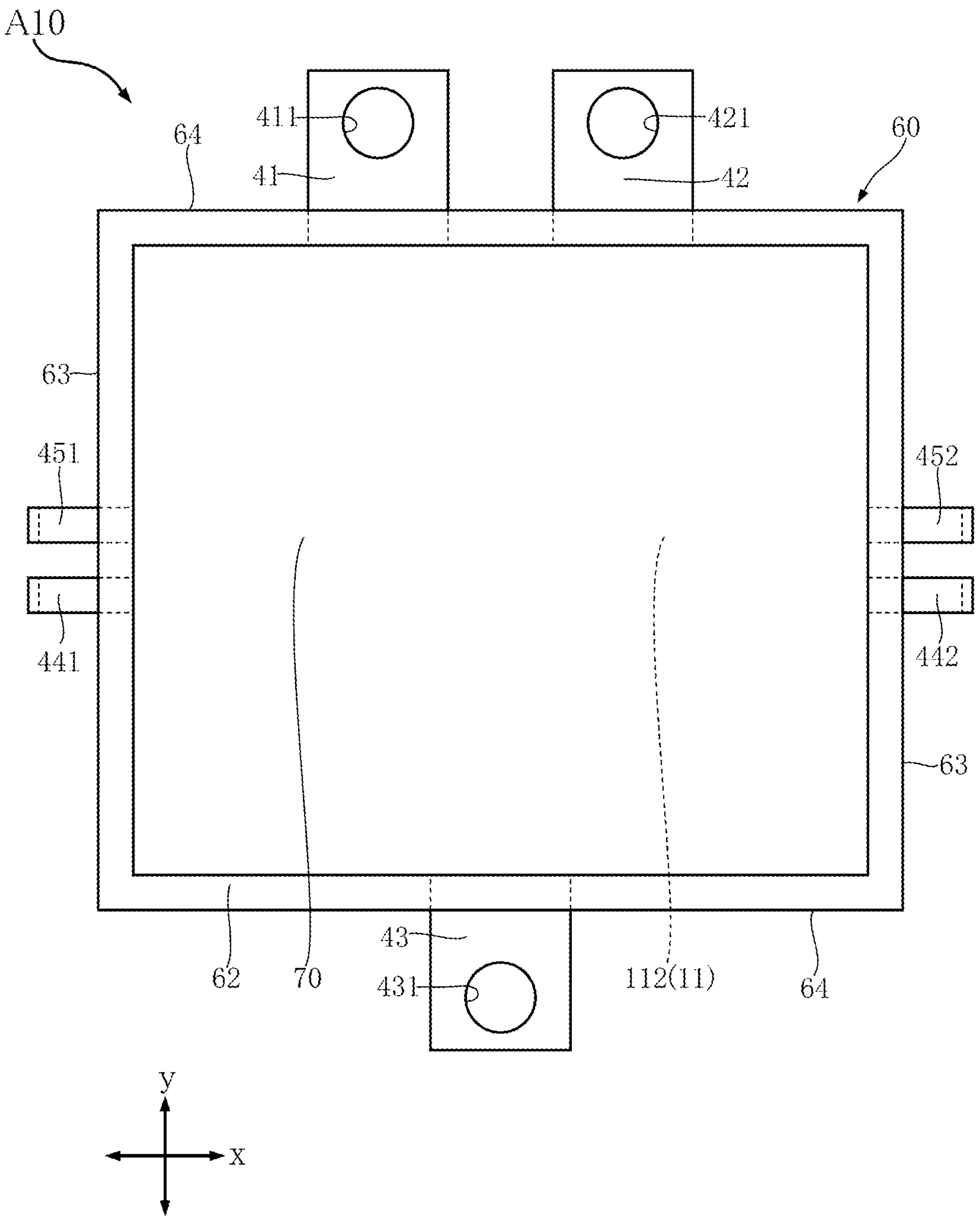
FIG. 4 is a bottom view of the semiconductor device shown in FIG. 1.

A semiconductor device A10 according to a first embodiment of the present disclosure is described below with reference to FIGS. 1 to 14. The semiconductor device A10 includes a substrate 11, a first wiring layer 12, a second wiring layer 13, a first semiconductor element 21, a second semiconductor element 22, a pair of diodes 23, a capacitor 24, a conductive member 30, a first input terminal 41, a second input terminal 42, an output terminal 43, a sealing resin 60, and a heat sink 70. The semiconductor device A10 further includes a first gate wiring layer 141, a second gate wiring layer 142, a first detection wiring layer 151, a second detection wiring layer 152, a second gate-electrode lead-out layer 162, a reverse electrode lead-out layer 17, a first gate terminal 441, a second gate terminal 442, a first detection terminal 451, a second detection terminal 452, a pair of gate wires 51, a pair of detection wires 52, a pair of first wires 53, and a pair of second wires 54. In FIG. 2, the sealing resin 60 is shown as transparent. FIG. 3 is a view corresponding to FIG. 2, in which the conductive member 30 and the output terminal 43 are also shown as transparent. In FIGS. 2 and 3, the contour of the sealing resin 40 shown as transparent is indicated by imaginary lines (two-dot chain lines). In FIG. 3, the contours of the conductive member 30 and the output terminal 43 are indicated by imaginary lines.

In the description of the semiconductor device A10, the direction orthogonal to the obverse surface 111 (described later) of the substrate 11 is referred to as the “thickness direction z”, for convenience. The thickness direction z corresponds to the thickness direction of each of the first wiring layer 12 and the second wiring layer 13. A direction orthogonal to the thickness direction z is referred to as the “first direction x”. The direction orthogonal to the thickness direction z and the first direction x is referred to as the “second direction y”.

The semiconductor device A10 converts a DC power supply voltage applied to the first input terminal 41 and the second input terminal 42 into AC power by the first semiconductor element 21 and the second semiconductor element 22. The converted AC power is input from the output terminal 43 to a power supply target such as a motor. The semiconductor device A10 forms a part of a power conversion circuit, such as an inverter.

Figure 5:
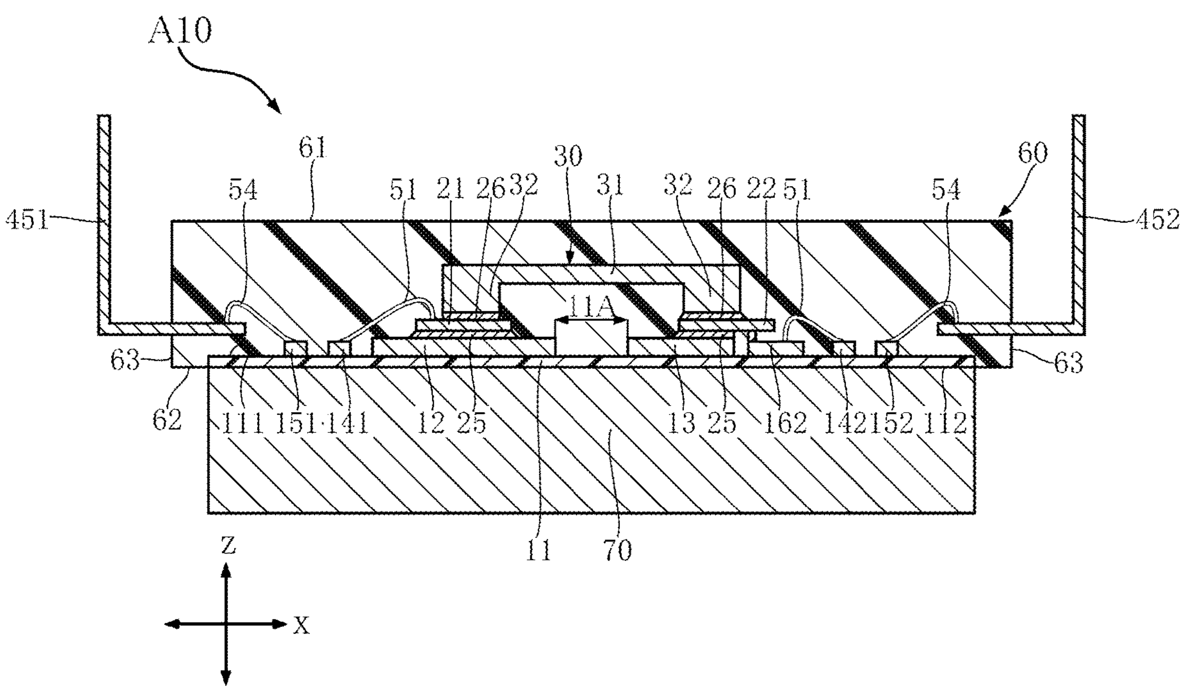
FIG. 5 is a sectional view taken along line V-V in FIG. 2.
Figure 6:
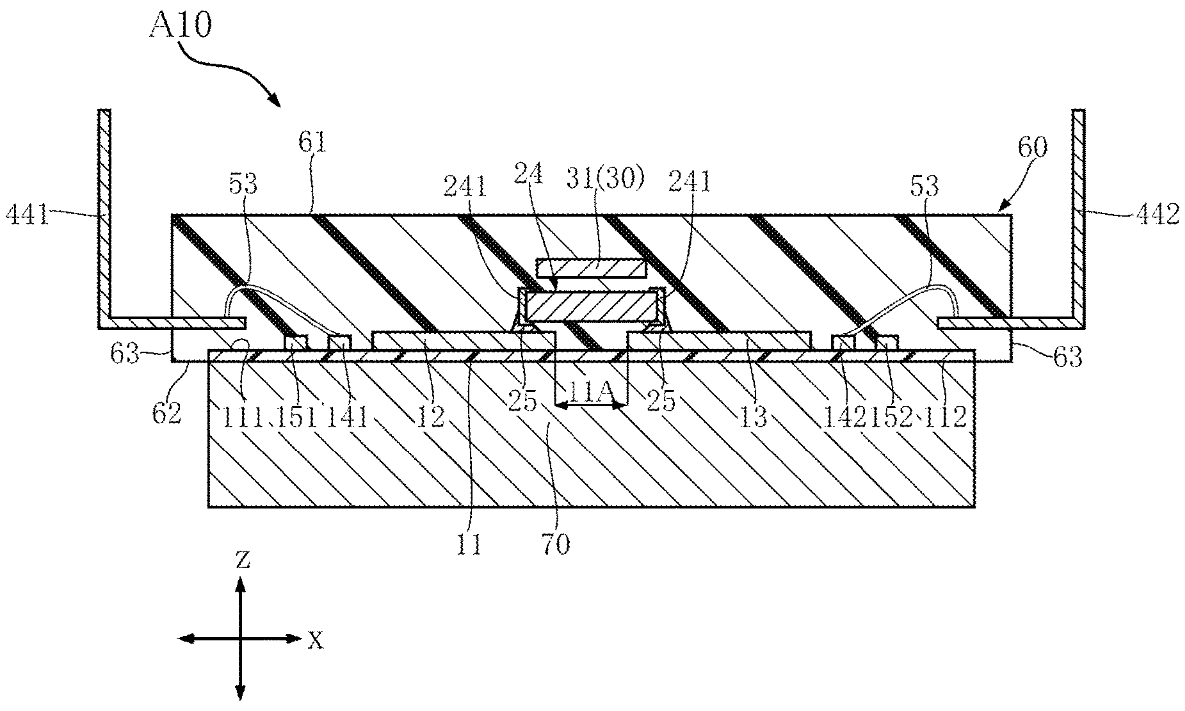
FIG. 6 is a sectional view taken along line VI-VI in FIG. 2.
Figure 7:
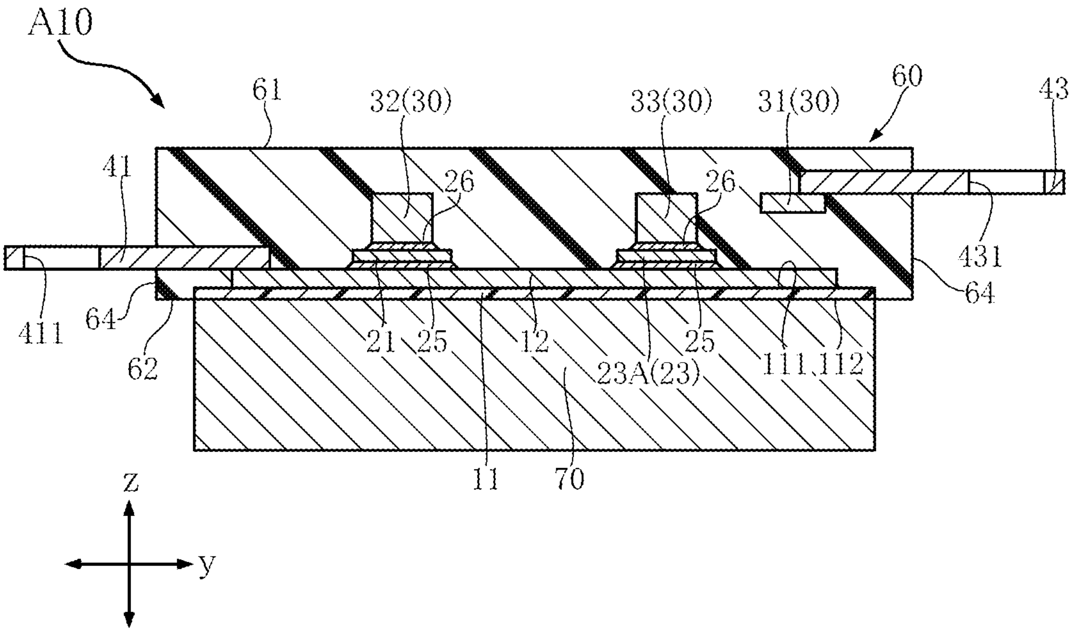
FIG. 7 is a sectional view taken along line VII-VII in FIG. 2.
Figure 8:
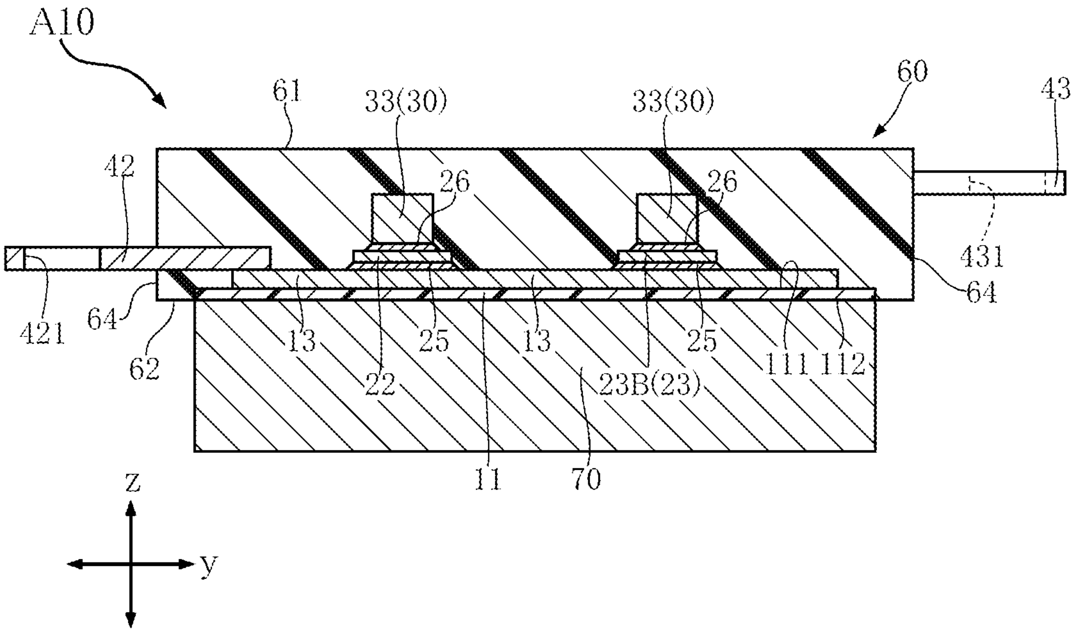
FIG. 8 is a sectional view taken along line VIII-VIII in FIG. 2.

As shown in FIGS. 5 and 7, the substrate 11 supports the first wiring layer 12, the second wiring layer 13, the first gate wiring layer 141, the second gate wiring layer 142, the first detection wiring layer 151, the second detection wiring layer 152, the second gate-electrode lead-out layer 162, the reverse electrode lead-out layer 17, and the sealing resin 60. As shown in FIGS. 7 and 8, the substrate 11 also supports the first gate terminal 441, the second gate terminal 442, the first detection terminal 451, and the second detection terminal 452. The substrate 11 is electrically insulating. As the material of the substrate 11, a material with a relatively high thermal conductivity is desirable. As an example, the substrate 11 is made of a ceramic material, which may be aluminum nitride (AlN), for example. The substrate 11 has an obverse surface 111 and a reverse surface 112 spaced apart from each other in the thickness direction z, and the reverse surface 112 faces away from the obverse surface 111. As shown in FIGS. 5 to 8, the obverse surface 111 is in contact with the sealing resin 60. The reverse surface 112 is exposed from the sealing resin 60.

As shown in FIGS. 2, 3 and 7, the first wiring layer 12 is disposed on the obverse surface 111 of the substrate 11. The first wiring layer 12 carries the first semiconductor element 21 and one diode 23 of the pair of diodes 23. The first wiring layer 12 is made of a material containing copper (Cu) or a copper alloy. As viewed in the thickness direction z, the first wiring layer 12 is in the form of a rectangle elongated in the second direction y. As viewed in the thickness direction z, the first wiring layer 12 is located inside the periphery of the substrate 11.

As shown in FIGS. 2, 3 and 8, the second wiring layer 13 is disposed on the obverse surface 111 of the substrate 11. The second wiring layer 13 carries the second semiconductor element 22 and the other diode 23 of the pair of diodes 23. The second wiring layer 13 is made of a material containing copper or a copper alloy. The second wiring layer 13 is spaced apart from the first wiring layer 12 in the first direction x. As viewed in the thickness direction z, the second wiring layer 13 is in the form of a rectangle with its longer side extending along the second direction y and has an indentation on the side closer to the second gate wiring layer 142 and the second detection wiring layer 152 in the first direction x. As viewed in the thickness direction z, the second wiring layer 13 is located inside the periphery of the substrate 11.

Figure 10:
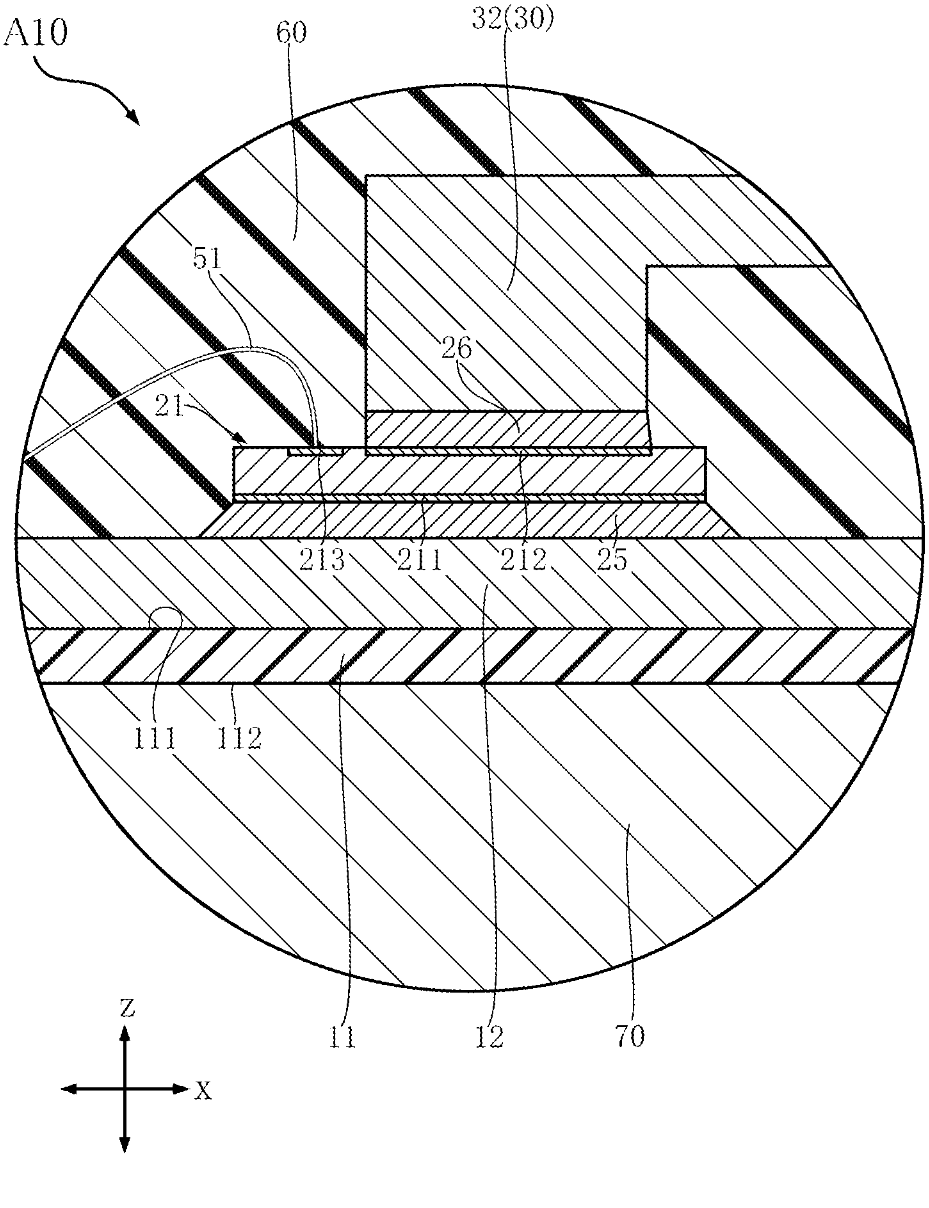
FIG. 10 is a sectional view taken along line X-X in FIG. 9.
Figure 11:
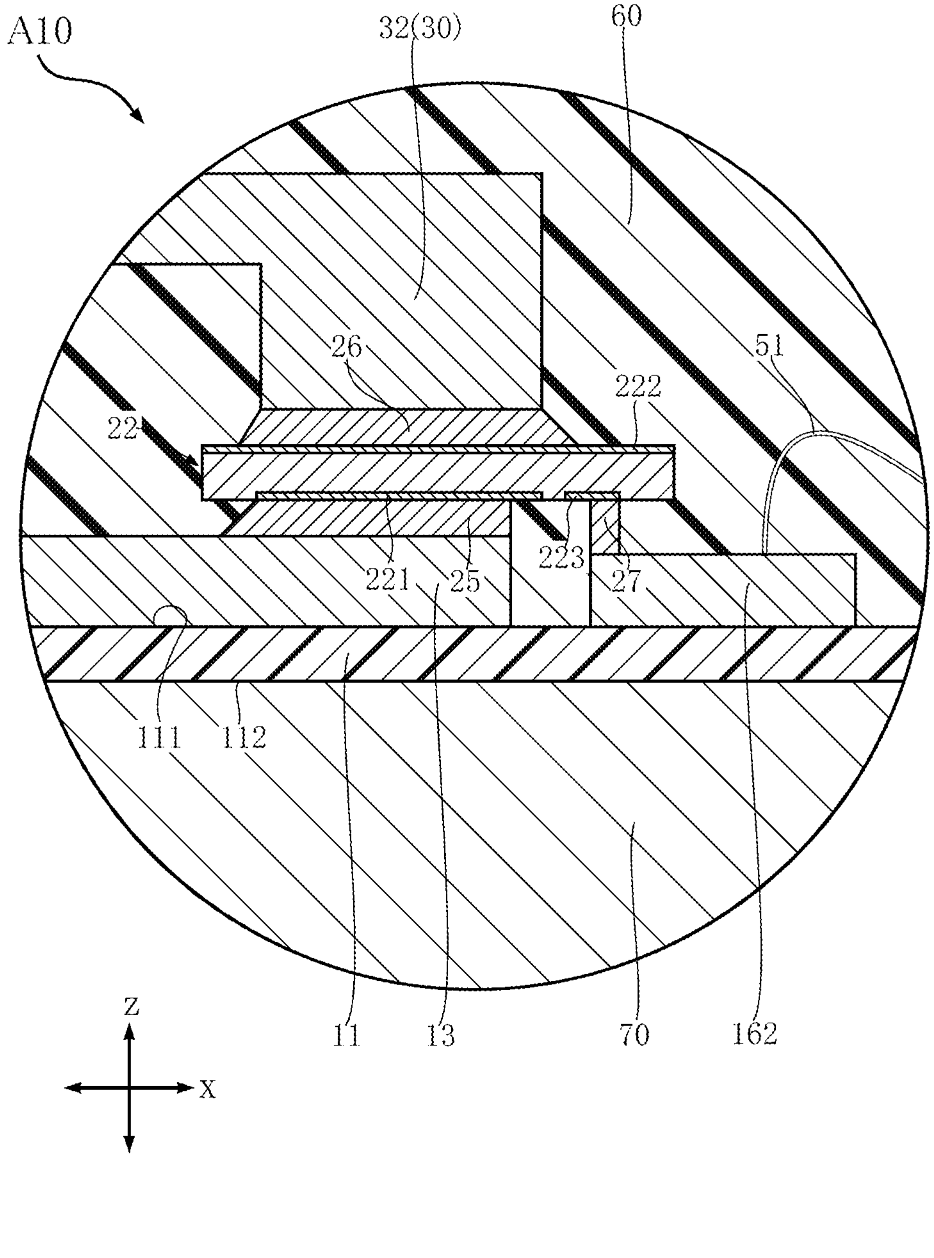
FIG. 11 is a sectional view taken along line XI-XI in FIG. 9.

As shown in FIGS. 10 and 11, each of the first wiring layer 12 and the second wiring layer 13 has a thickness larger than that of the substrate 11. As shown in FIGS. 2 and 3, the substrate 11 has an exposed portion 11A located between the first wiring layer 12 and the second wiring layer 13 as viewed in the thickness direction z. The exposed portion 11A is elongated along the second direction y.

As shown in FIGS. 2, 3 and 5, the first semiconductor element 21 is bonded to the first wiring layer 12. The first semiconductor element 21 is a MOSFET (Metal-Oxide-Semiconductor Field-Effect Transistor), for example. Alternatively, the first semiconductor element 21 may be a field-effect transistor including a MISFET (Metal-Insulator-Semiconductor Field-Effect Transistor) or a bipolar transistor such as an IGBT (Insulated Gate Bipolar Transistor). The first semiconductor element 21 includes a compound semiconductor substrate. The composition of the compound semiconductor substrate includes silicon carbide (SiC). That is, the compound semiconductor substrate contains silicon carbide (SiC). The semiconductor device A10 is described below as to the case in which the first semiconductor element 21 is an n-channel MOSFET of a vertical-structure type.

Figure 9:
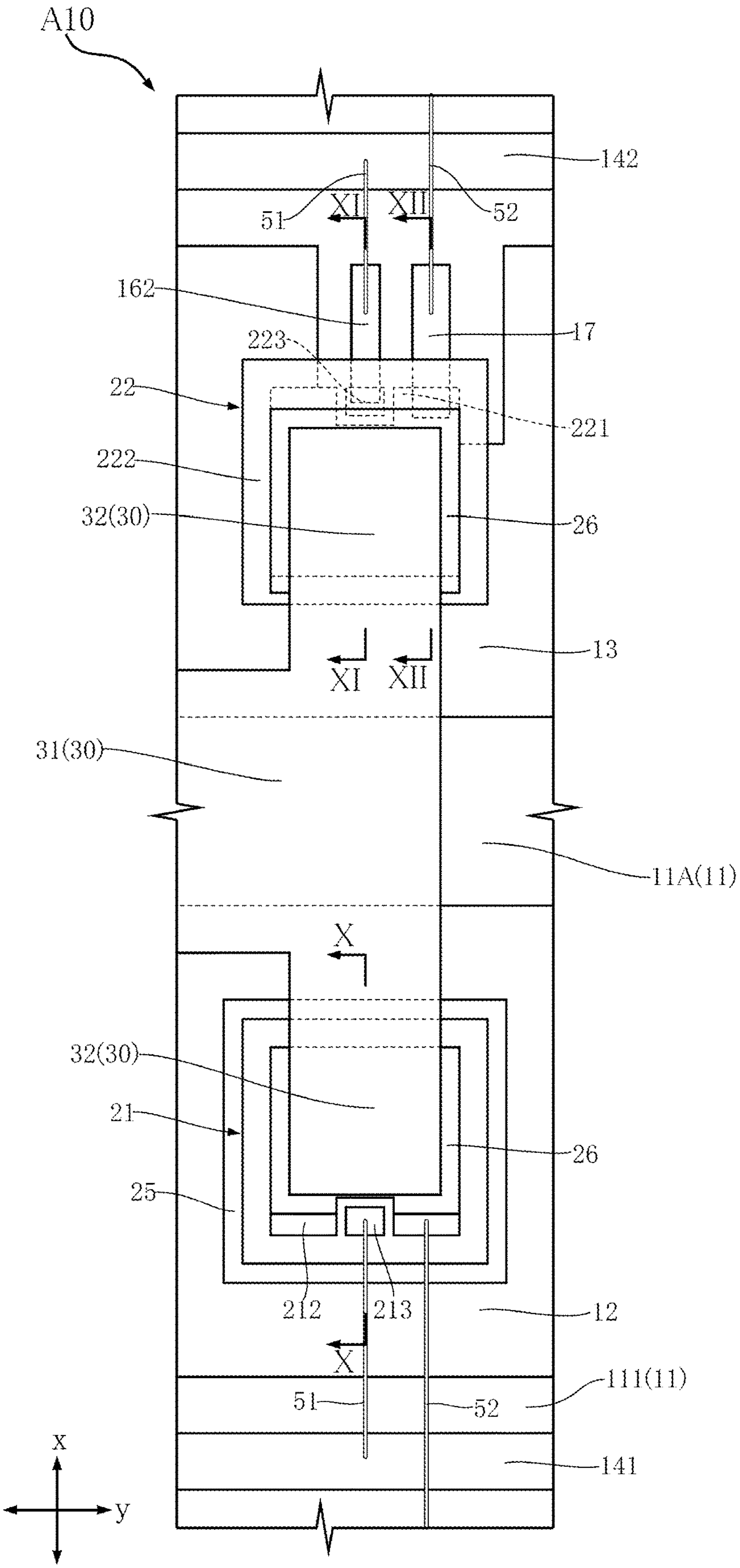
FIG. 9 is an enlarged view of a part of FIG. 2.

As shown in FIGS. 9 and 10, the first semiconductor element 21 has a first reverse electrode 211, a first obverse electrode 212, and a first gate electrode 213. The first reverse electrode 211 is disposed to oppose the first wiring layer 12. A current corresponding to the power to be converted by the first semiconductor element 21 flows in the first reverse electrode 211. That is, the first reverse electrode 211 corresponds to the drain electrode of the first semiconductor element 21. The first reverse electrode 211 is bonded to the first wiring layer 12 with a first bonding layer 25. The first bonding layer 25 is electrically conductive. The first bonding layer 25 is lead-free solder, for example. Alternatively, the first bonding layer 25 may be a sintered metal containing silver (Ag), for example. Thus, the first reverse electrode 211 is electrically connected to the first wiring layer 12.

As shown in FIG. 10, the first obverse electrode 212 is disposed to face the same side as the obverse surface 111 of the substrate 11 in the thickness direction z. Thus, the first reverse electrode 211 and the first obverse electrode 212 are located opposite to each other in the thickness direction z. A current corresponding to the power converted by the first semiconductor element 21 flows in the first obverse electrode 212. That is, the first obverse electrode 212 corresponds to the source electrode of the first semiconductor element 21. The first obverse electrode 212 includes a plurality of metal plating layers. The first obverse electrode 212 includes a nickel (Ni)-plating layer and a gold (Au)-plating layer formed on the nickel-plating layer. Alternatively, the first obverse electrode 212 may include a nickel-plating layer, a palladium (Pd)-plating layer formed on the nickel-plating layer, and a gold-plating layer formed on the palladium-plating layer.

As shown in FIGS. 9 and 10, in the semiconductor device A10, the first gate electrode 213 is located on the same side as the first obverse electrode 212 in the thickness direction z. A gate voltage for driving the first semiconductor element 21 is applied to the first gate electrode 213. In the first semiconductor element 21, a current corresponding to the voltage applied to the first reverse electrode 211 is converted based on the gate voltage. As shown in FIG. 9, as viewed in the thickness direction z, the area of the first gate electrode 213 is smaller than that of the first obverse electrode 212.

As shown in FIGS. 2, 3 and 5, the second semiconductor element 22 is bonded to the second wiring layer 13. The second semiconductor element 22 is a transistor of the same type as the first semiconductor element 21. Thus, in the semiconductor device A10, the second semiconductor element 22 is a MOSFET.

As shown in FIGS. 9 and 11, the second semiconductor element 22 has a second reverse electrode 221, a second obverse electrode 222, and a second gate electrode 223. The second reverse electrode 221 is disposed to oppose the second wiring layer 13. A current corresponding to the power converted by the second semiconductor element 22 flows in the second reverse electrode 221. That is, the second reverse electrode 221 corresponds to the source electrode of the second semiconductor element 22. The second reverse electrode 221 is bonded to the second wiring layer 13 with the first bonding layer 25. Thus, the second reverse electrode 221 is electrically connected to the second wiring layer 13.

As shown in FIG. 11, the second obverse electrode 222 is disposed to face the same side as the obverse surface 111 of the substrate 11 in the thickness direction z. Thus, the second reverse electrode 221 and the second obverse electrode 222 are located opposite to each other in the thickness direction z. A current corresponding to the power to be converted by the second semiconductor element 22 flows in the second obverse electrode 222. That is, the second obverse electrode 222 corresponds to the drain electrode of the second semiconductor element 22. As with the first obverse electrode 212 of the first semiconductor element 21, the second obverse electrode 222 includes a plurality of metal plating layers. The configuration of the metal plating layers is the same as that of the metal plating layers included in the first obverse electrode 212.

As shown in FIGS. 9 and 11, in the semiconductor device A10, the second gate electrode 223 is located on the same side as the second reverse electrode 221 in the thickness direction z. A gate voltage for driving the second semiconductor element 22 is applied to the second gate electrode 223. In the second semiconductor element 22, a current corresponding to the voltage applied to the second obverse electrode 222 is converted based on the gate voltage. As shown in FIG. 9, as viewed in the thickness direction z, the area of the second gate electrode 223 is smaller than that of the second reverse electrode 221.

In the semiconductor device A10, the configuration of the second semiconductor element 22 is identical to that of the first semiconductor element 21 inverted about an axis orthogonal to the thickness direction z. That is, the second semiconductor element 22 corresponds to the first semiconductor element 21 flip-chip bonded to the second wiring layer 13. Polarities of the first obverse electrode 212 of the first semiconductor element 21 and the second obverse electrode 222 of the second semiconductor element 22 are different from each other.

Figure 13:
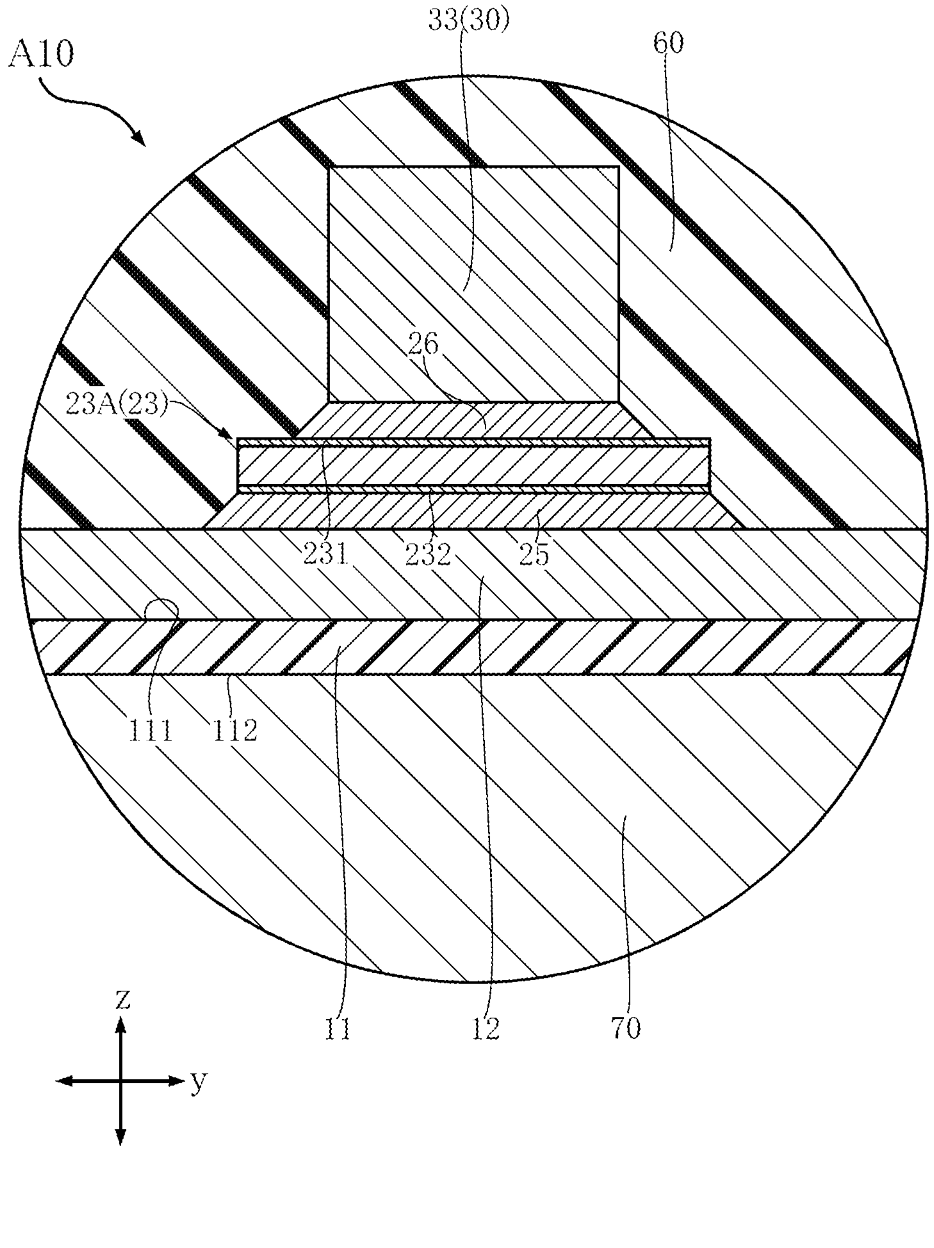
FIG. 13 is an enlarged view of a part of FIG. 7.
Figure 14:
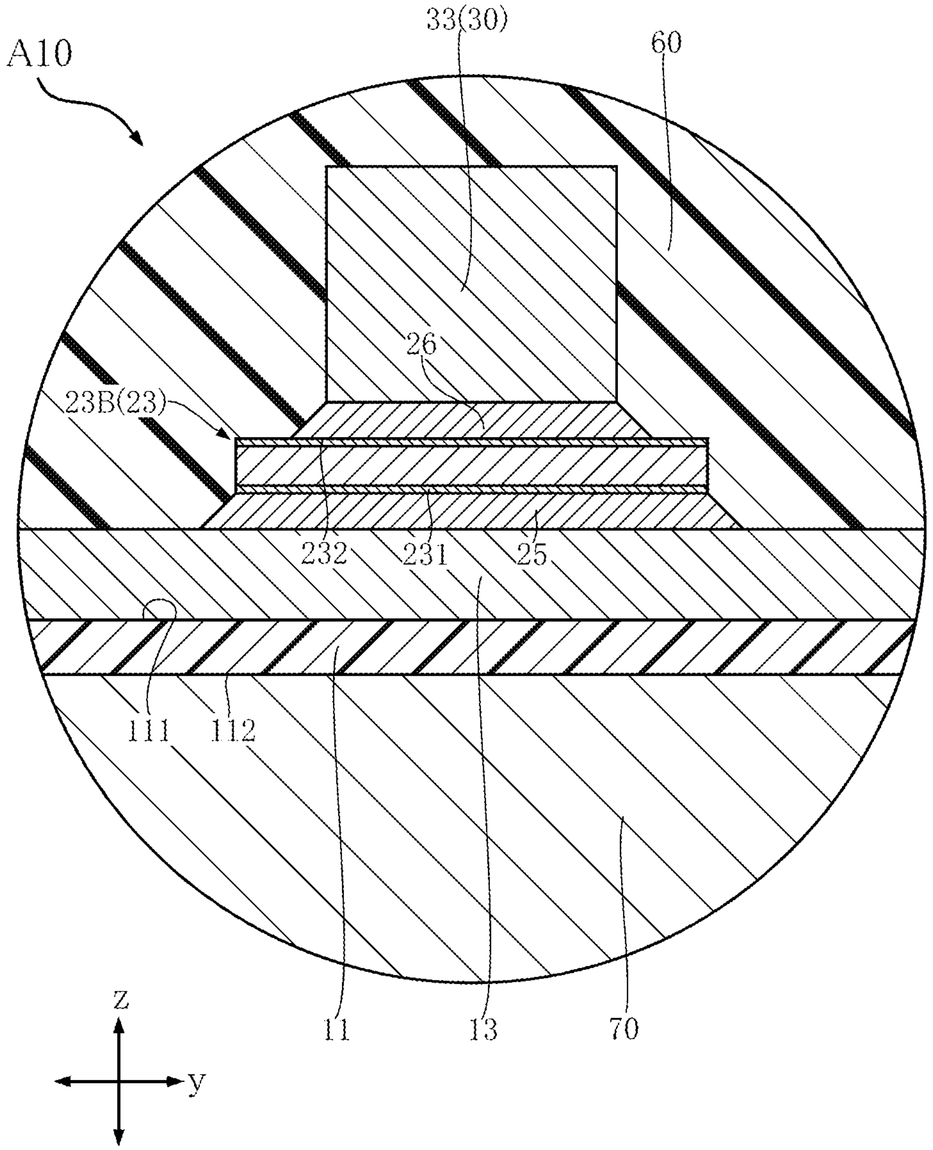
FIG. 14 is an enlarged view of a part of FIG. 8.

As shown in FIGS. 2, 3, 7 and 8, the pair of diodes 23 are bonded to the first wiring layer 12 and the second wiring layer 13, respectively. The pair of diodes 23 include a first diode 23A and a second diode 23B. The first diode 23A is bonded to the first wiring layer 12. The second diode 23B is bonded to the second wiring layer 13. The pair of diodes 23 are Schottky barrier diodes, for example. The first diode 23A is connected in parallel to the first semiconductor element 21. The second diode 23B is connected in parallel to the second semiconductor element 22. The diodes 23 are used as freewheel diodes arranged such that when a reverse bias is applied to the first semiconductor element 21 and/or the second semiconductor element 22, current will flow not through the first and the second semiconductor elements 21, 22 but through the diodes 23 connected in parallel to the semiconductor elements. As shown in FIGS. 13 and 14, the pair of diodes 23 each have an anode electrode 231 and a cathode electrode 232. The anode electrode 231 and the cathode electrode 232 are located opposite to each other in the thickness direction z. In the semiconductor device A10, when the first semiconductor element 21 and the second semiconductor element 22 are MOSFETs, each of the first semiconductor element 21 and the second semiconductor element 22 may incorporate a diode element that functions as an alternative to the diode 23. In this case, the pair of diodes 23 are not necessary.

As shown in FIG. 13, in the first diode 23A, the anode electrode 231 is disposed to face the same side as the obverse surface 111 of the substrate 11 in the thickness direction z. The cathode electrode 232 of the first diode 23A is disposed to oppose the first wiring layer 12. The cathode electrode 232 of the first diode 23A is bonded to the first wiring layer 12 with the first bonding layer 25. Thus, the cathode electrode 232 of the first diode 23A is electrically connected to the first wiring layer 12.

As shown in FIG. 14, in the second diode 23B, the cathode electrode 232 is disposed to face the same side as the obverse surface 111 of the substrate 11 in the thickness direction z. The anode electrode 231 of the second diode 23B is disposed to oppose the second wiring layer 13. The anode electrode 231 of the second diode 23B is bonded to the second wiring layer 13 with the first bonding layer 25. Thus, the anode electrode 231 of the second diode 23B is electrically connected to the second wiring layer 13.

As shown in FIGS. 3 and 6, the capacitor 24 is bonded to first wiring layer 12 and the second wiring layer 13. As viewed in the thickness direction z, the capacitor 24 overlaps with the exposed portion 11A of the substrate 11. The capacitor 24 is a ceramic capacitor, for example. The capacitor 24 has a pair of electrodes 241. The pair of electrodes 241 are spaced apart from each other in the first direction x. One electrode 241 of the pair of electrodes 241 is bonded to the first wiring layer 12 with the first bonding layer 25. The other electrode 241 of the pair of electrodes 241 is bonded to the second wiring layer 13 with the first bonding layer 25. Thus, the capacitor 24 is electrically connected to the first wiring layer 12 and the second wiring layer 13.

As shown in FIGS. 2, 3 and 5, the first gate wiring layer 141 is disposed on the obverse surface 111 of the substrate 11. The first gate wiring layer 141 is located on the opposite side of the second wiring layer 13 with respect to the first wiring layer 12 in the first direction x. The first gate wiring layer 141 is electrically connected to the first gate electrode 213 of the first semiconductor element 21. The first gate wiring layer 141 is elongated in the second direction y. The first gate wiring layer 141 is made of a material containing copper or a copper alloy.

As shown in FIGS. 2 and 3, the first gate terminal 441 is located on one side of the substrate 11 in the first direction x. The first gate terminal 441 is electrically connected to the first gate wiring layer 141. The first gate terminal 441 is a metal lead made of a material containing copper or a copper alloy. As shown in FIGS. 1 and 6, a part of the first gate terminal 441 is covered with the sealing resin 60. As viewed in the second direction y, the first gate terminal 441 is L-shaped. As shown in FIG. 6, the first gate terminal 441 includes a part standing in the thickness direction z. This part is exposed from the sealing resin 60. A gate voltage for driving the first semiconductor element 21 is applied to the first gate terminal 441.

As shown in FIGS. 2, 3 and 5, the second gate wiring layer 142 is disposed on the obverse surface 111 of the substrate 11. In the first direction x, the second gate wiring layer 142 is located on the opposite side of the first wiring layer 12 with respect to the second wiring layer 13. The second gate wiring layer 142 is electrically connected to the second gate electrode 223 of the second semiconductor element 22. The second gate wiring layer 142 is elongated in the second direction y. The second gate wiring layer 142 is made of a material containing copper or a copper alloy.

As shown in FIGS. 2, 3 and 9, the second gate-electrode lead-out layer 162 is disposed on the obverse surface 111 of the substrate 11. The second gate-electrode lead-out layer 162 is located within the indentation formed in the second wiring layer 13. As viewed in the thickness direction z, the second semiconductor element 22 overlaps with the second gate-electrode lead-out layer 162. The second gate-electrode lead-out layer 162 is electrically connected to the second gate wiring layer 142. The second gate-electrode lead-out layer 162 is elongated in the first direction x. The second gate-electrode lead-out layer 162 is made of a material containing copper or a copper alloy. As shown in FIG. 11, the second gate electrode 223 of the second semiconductor element 22 is bonded to the second gate-electrode lead-out layer 162 with a third bonding layer 27. The third bonding layer 27 is electrically conductive. The third bonding layer 27 is lead-free solder, for example. Alternatively, the third bonding layer 27 may be a sintered metal containing silver, for example. Thus, the second gate-electrode 223 is electrically connected to the second gate-electrode lead-out layer 162.

As shown in FIGS. 2 and 3, the second gate terminal 442 is located on the opposite side of the first gate terminal 441 with respect to the substrate 11 in the first direction x. The second gate terminal 442 is electrically connected to the second gate wiring layer 142. The second gate terminal 442 is a metal lead made of a material containing copper or a copper alloy. As shown in FIGS. 1 and 6, a part of the second gate terminal 442 is covered with the sealing resin 60. As viewed in the second direction y, the second gate terminal 442 is L-shaped. As shown in FIG. 6, the second gate terminal 442 includes a part standing in the thickness direction z. This part is exposed from the sealing resin 60. A gate voltage for driving the second semiconductor element 22 is applied to the second gate terminal 442.

As shown in FIGS. 2, 3 and 6, the first wires 53 are bonded to the first gate terminal 441 and the second gate terminal 442, respectively, and also to the first gate wiring layer 141 and the second gate wiring layer 142, respectively. Thus, the first gate terminal 441 is electrically connected to the first gate wiring layer 141, and the second gate terminal 442 is electrically connected to the second gate wiring layer 142. The composition of each of the first wires 53 includes gold. Alternatively, the composition of each of the first wires 53 may include copper or aluminum (Al).

As shown in FIGS. 2, 3 and 5, the first detection wiring layer 151 is disposed on the obverse surface 111 of the substrate 11. The first detection wiring layer 151 is located next to the first gate wiring layer 141 in the first direction x. The first detection wiring layer 151 is electrically connected to the first obverse electrode 212 of the first semiconductor element 21. The first detection wiring layer 151 is elongated in the second direction y. The first detection wiring layer 151 is made of a material containing copper or a copper alloy.

As shown in FIGS. 2 and 3, the first detection terminal 451 is located on the same side of the substrate 11 as the first gate terminal 441 in the first direction x and next to the first gate terminal 441 in the second direction y. Thus, the first detection terminal 451 is located closer to the first gate terminal 441 than to the second gate terminal 442. The first detection terminal 451 is electrically connected to the first detection wiring layer 151. The first detection terminal 451 is a metal lead made of a material containing copper or a copper alloy. As shown in FIGS. 1 and 5, a part of the first detection terminal 451 is covered with the sealing resin 60. As viewed in the second direction y, the first detection terminal 451 is L-shaped. As shown in FIG. 5, the first detection terminal 451 includes a part standing in the thickness direction z. This part is exposed from the sealing resin 60. A voltage corresponding to the current flowing in the first obverse electrode 212 of the first semiconductor element 21 is applied to the first detection terminal 451.

As shown in FIGS. 2, 3 and 5, the second detection wiring layer 152 is disposed on the obverse surface 111 of the substrate 11. The second detection wiring layer 152 is located next to the second gate wiring layer 142 in the first direction x. The second detection wiring layer 152 is electrically connected to the second reverse electrode 221 of the second semiconductor element 22. The second detection wiring layer 152 is elongated in the second direction y. The second detection wiring layer 152 is made of a material containing copper or a copper alloy.

Figure 12:
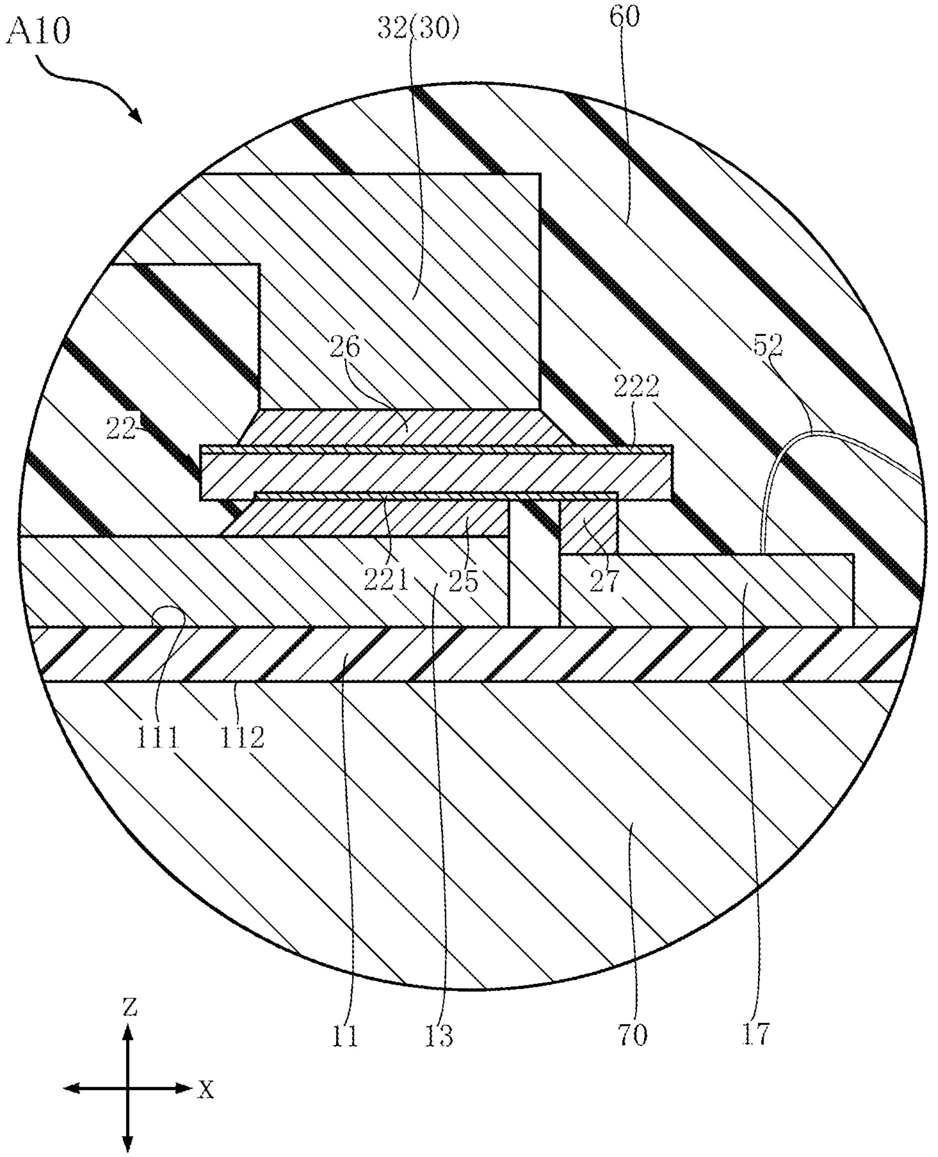
FIG. 12 is a sectional view taken along line XII-XII in FIG. 9.

As shown in FIGS. 2, 3 and 9, the reverse electrode lead-out layer 17 is disposed on the obverse surface 111 of the substrate 11. The reverse electrode lead-out layer 17 is located within the indentation formed in the second wiring layer 13 and next to the second gate-electrode lead-out layer 162 in the second direction y. As viewed in the thickness direction z, the second semiconductor element 22 overlaps with the reverse electrode lead-out layer 17. The reverse electrode lead-out layer 17 is electrically connected to the second detection wiring layer 152. The reverse electrode lead-out layer 17 is elongated in the first direction x. The reverse electrode lead-out layer 17 is made of a material containing copper or a copper alloy. As shown in FIG. 12, the second reverse electrode 221 of the second semiconductor element 22 is bonded to the reverse electrode lead-out layer 17 with the third bonding layer 27. Thus, the second reverse electrode 221 is electrically connected to the reverse electrode lead-out layer 17.

As shown in FIGS. 2 and 3, the second detection terminal 452 is located on the same side of the substrate 11 as the second gate terminal 442 in the first direction x and next to the second gate terminal 442 in the second direction y. Thus, the second detection terminal 452 is located closer to the second gate terminal 442 than to the first gate terminal 441. The second detection terminal 452 is electrically connected to the second detection wiring layer 152. The second detection terminal 452 is a metal lead made of a material containing copper or a copper alloy. As shown in FIGS. 1 and 5, a part of the second detection terminal 452 is covered with the sealing resin 60. As viewed in the second direction y, the second detection terminal 452 is L-shaped. As shown in FIG. 5, the second detection terminal 452 includes a part standing in the thickness direction z. This part is exposed from the sealing resin 60. A voltage corresponding to the current flowing in the second reverse electrode 221 of the second semiconductor element 22 is applied to the second detection terminal 452.

As shown in FIGS. 2, 3 and 5, the second wires 54 are bonded to the first detection terminal 451 and the second detection terminal 452, respectively, and also to the first detection wiring layer 151 and the second detection wiring layer 152, respectively. Thus, the first detection terminal 451 is electrically connected to the first detection wiring layer 151, and the second detection terminal 452 is electrically connected to the second detection wiring layer 152. The composition of each of the second wires 54 includes gold. Alternatively, the composition of each of the second wires 54 may include copper or aluminum.

As shown in FIGS. 5 to 8, the conductive member 30 is spaced apart from the substrate 11 in the sense of the thickness direction z which the obverse surface 111 faces. The conductive member 30 is bonded to the first obverse electrode 212 of the first semiconductor element 21 and the second obverse electrode 222 of the second semiconductor element 22. The conductive member 30 is also bonded to the anode electrode 231 of the first diode 23A and the cathode electrode 232 of the second diode 23B. The conductive member 30 is made of a single lead frame. The lead frame is made of a material containing copper or a copper alloy, for example. As shown in FIG. 2, as viewed in the thickness direction z, the conductive member 30 overlaps with the exposed portion 11A of the substrate 11.

As shown in FIGS. 2 and 5 to 8, the conductive member 30 includes a base portion 31, a pair of first bonding portions 32, and a pair of second bonding portions 33. The base portion 31 is elongated in the second direction y. As viewed in the thickness direction z, the base portion 31 overlaps with the exposed portion 11A of the substrate 11, the first wiring layer 12, the second wiring layer 13, and the capacitor 24.

As shown in FIGS. 2, 5 and 9, the pair of first bonding portions 32 are connected to opposite ends of the base portion 31 in the first direction x. As shown in FIGS. 9 to 11, the first bonding portions 32 are bonded to the first obverse electrode 212 of the first semiconductor element 21 and the second obverse electrode 222 of the second semiconductor element 22, respectively, with a second bonding layer 26. The second bonding layer 26 is electrically conductive. The second bonding layer 26 is lead-free solder, for example. Alternatively, the second bonding layer 26 may be a sintered metal containing silver, for example. Thus, the first obverse electrode 212 and the second obverse electrode 222 are electrically connected to the conductive member 30.

As shown in FIG. 2, the pair of second bonding portions 33 are connected to opposite ends of the base portion 31 in the first direction x and spaced apart from the pair of first bonding portions 32 in the second direction y. As shown in FIGS. 13 and 14, the second bonding portions 33 are bonded to the anode electrode 231 of the first diode 23A and the cathode electrode 232 of the second diode 23B, respectively, with the second bonding layer 26. Thus, the anode electrode 231 of the first diode 23A and the cathode electrode 232 of the second diode 23B are electrically connected to the conductive member 30.

As shown in FIGS. 1-3, the first input terminal 41 is located on a first side of the substrate 11 in the second direction y. The first input terminal 41 is electrically connected to the first wiring layer 12. As shown in FIG. 7, in the semiconductor device A10, the first input terminal 41 is bonded to the first wiring layer 12. The first input terminal 41 is a metal plate made of a material containing copper or a copper alloy. A part of the first input terminal 41 is covered with the sealing resin 60. The first input terminal 41 has a first mounting hole 411 penetrating in the thickness direction z. The first mounting hole 411 is exposed from the sealing resin 60. The first input terminal 41 is the P terminal (positive electrode) to which a DC power supply voltage to be converted is applied.

As shown in FIGS. 1 to 3, the second input terminal 42 is located on the same side of the substrate 11 as the first input terminal 41 (i.e., on the first side) in the second direction y. The second input terminal 42 is spaced apart from the first input terminal 41 in the first direction x. The second input terminal 42 is electrically connected to the second wiring layer 13. As shown in FIG. 8, in the semiconductor device A10, the second input terminal 42 is bonded to the second wiring layer 13. The second input terminal 42 is a metal plate made of a material containing copper or a copper alloy. A part of the second input terminal 42 is covered with the sealing resin 60. The second input terminal 42 has a second mounting hole 421 penetrating in the thickness direction z. The second mounting hole 421 is exposed from the sealing resin 60. The second input terminal 42 is the N terminal (negative electrode) to which a DC power supply voltage to be converted is applied.

As shown in FIGS. 1 and 2, the output terminal 43 is located on the opposite side of the first input terminal 41 and the second input terminal 42 (i.e., on a second side) with respect to the substrate 11 in the second direction y. As shown in FIG. 7, the output terminal 43 is spaced apart from the substrate 11 in the sense of the thickness direction z in which the obverse surface 111 faces. The output terminal 43 is electrically connected to the conductive member 30. The output terminal 43 is bonded to the base portion 31 of the conductive member 30. The output terminal 43 is a metal plate made of a material containing copper or a copper alloy. A part of the output terminal 43 is covered with the sealing resin 60. The output terminal 43 has a third mounting hole 431 penetrating in the thickness direction z. The third mounting hole 431 is exposed from the sealing resin 60. The AC power converted by the first semiconductor element 21 and the second semiconductor element 22 is outputted from the output terminal 43.

As shown in FIGS. 2, 3 and 9, one gate wire 51 of the pair of gate wires 51 is bonded to the first gate electrode 213 of the first semiconductor element 21 and the first gate wiring layer 141. Thus, the first gate electrode 213 is electrically connected to the first gate wiring layer 141, and also electrically connected to the first gate terminal 441 with one of the pair of first wires 53. As shown in FIGS. 2, 3 and 9, the other gate wire 51 of the pair of gate wires 51 is bonded to the second gate-electrode lead-out layer 162 and the second gate wiring layer 142. Thus, the second gate electrode 223 of the second semiconductor element 22 is electrically connected to the second gate wiring layer 142, and also electrically connected to the second gate terminal 442 with the other one of the pair of first wires 53. The composition of each of the gate wires 51 includes gold. Alternatively, the composition of each of the gate wires 51 may include aluminum or copper.

As shown in FIGS. 2, 3 and 9, one detection wire 52 of the pair of detection wires 52 is bonded to the first obverse electrode 212 of the first semiconductor element 21 and the first detection wiring layer 151. Thus, the first obverse electrode 212 is electrically connected to the first detection wiring layer 151, and also electrically connected to the first detection terminal 451 with one of the pair of second wires 54. As shown in FIGS. 2, 3 and 9, the other detection wire 52 of the pair of detection wires 52 is bonded to the reverse electrode lead-out layer 17 and the second detection wiring layer 152. Thus, the second reverse electrode 221 of the second semiconductor element 22 is electrically connected to the second detection wiring layer 152, and also electrically connected to the second detection terminal 452 with the other one of the pair of second wires 54. The composition of each of the detection wires 52 includes gold. Alternatively, the composition of each of the detection wires 52 may include aluminum or copper.

As shown in FIGS. 1 and 5 to 8, the sealing resin 60 covers the first wiring layer 12, the second wiring layer 13, the first gate wiring layer 141, the second gate wiring layer 142, the first detection wiring layer 151, the second detection wiring layer 152, the second gate-electrode lead-out layer 162, the reverse electrode lead-out layer 17, the first semiconductor element 21, the second semiconductor element 22, the pair of diodes 23, the capacitor 24, and the conductive member 30. The sealing resin 60 also covers a part of each of the substrate 11, the first input terminal 41, the second input terminal 42, the output terminal 43, the first gate terminal 441, the second gate terminal 442, the first detection terminal 451, and the second detection terminal 452. The sealing resin 60 is electrically insulating. The sealing resin 60 is made of a material containing black epoxy resin, for example. The sealing resin 60 includes a part held between the exposed portion 11A of the substrate 11 and the base portion 31 of the conductive member 30 in the thickness direction z.

As shown in FIGS. 1, 4 and 5 to 8, the sealing resin 60 has a top surface 61, a bottom surface 62, a pair of first side surfaces 63, and a pair of second side surfaces 64. The top surface 61 faces the same side as the obverse surface 111 of the substrate 11 in the thickness direction z. The area of the top surface 61 is larger than that of the obverse surface 111. The bottom surface 62 faces away from the top surface 61 in the thickness direction z. The reverse surface 112 of the substrate 11 is exposed from the bottom surface 62. The pair of first side surfaces 63 are spaced apart from each other in the first direction x and connected to the top surface 61 and the bottom surface 62. The first gate terminal 441 and the first detection terminal 451 are exposed through one first side surface 63 of the pair of first side surfaces 63. The second gate terminal 442 and the second detection terminal 452 are exposed through the other first side surface 63 of the pair of first side surfaces 63. The pair of second side surfaces 64 are spaced apart from each other in the second direction y and connected to the top surface 61 and the bottom surface 62. The first input terminal 41 and the second input terminal 42 are exposed through one second side surface 64 of the pair of second side surfaces 64. The output terminal 43 is exposed through the other second side surface 64 of the pair of second side surfaces 64.

As shown in FIGS. 4 to 8, the heat sink 70 is bonded to the reverse surface 112 of the substrate 11. Thus, the substrate 11 is located between the heat sink 70 and the first wiring layer 12, the second wiring layer 13 and the conductive member 30 in the thickness direction z. The heat sink 70 is made of a material containing aluminum, for example.

The advantages of the semiconductor device A10 are described below.

The semiconductor device A10 includes a conductive member 30 spaced apart from the substrate 11 in the sense of the thickness direction z which the obverse surface 111 faces. The conductive member 30 is bonded to the first obverse electrode 212 of the first semiconductor element 21 and the second obverse electrode 222 of the second semiconductor element 22. Polarities of the first obverse electrode 212 and the second obverse electrode 222 are different from each other. The substrate 11 has an exposed portion 11A located between the first wiring layer 12 and the second wiring layer 13 as viewed in the thickness direction z. As viewed in the thickness direction z, the conductive member 30 overlaps with the exposed portion 11A. Such a configuration makes larger the distance from the exposed portion 11A to the conductive member 30 in the thickness direction z. In an example, when the heat sink 70 is set as a ground electrode, the parasitic capacitance of the semiconductor device A10 associated with the conductive member 30 and the substrate 11 is inversely proportional to the above distance. Thus, as the above distance becomes larger, the parasitic capacitance becomes smaller. Accordingly, less electric charge is stored in the conductive member 30 with the switching of the first semiconductor element 21 and the second semiconductor element 22, which leads to reduction in the leakage current from the semiconductor device A10. Thus, the semiconductor device A10 can reduce noise due to leakage current from the device.

The semiconductor device A10 further includes the second gate-electrode lead-out layer 162 disposed on the obverse surface 111 of the substrate 11 and electrically connected to the second gate wiring layer 142. The second gate electrode 223 of the second semiconductor element 22 is located on the same side as the second reverse electrode 221 in the thickness direction z. The second gate electrode 223 is bonded to the second gate-electrode lead-out layer 162. With such a configuration, the polarity of the first obverse electrode 212 of the first semiconductor element 21 and the polarity the second obverse electrode 222 of the second semiconductor element 22 can be made different from each other without hindering the driving of the second semiconductor element 22. Thus, the first obverse electrode 212 and the second obverse electrode 222 can be electrically connected to each other via the conductive member 30.

The conductive member 30 has the base portion 31 elongated in the second direction y and a pair of bonding portions (first bonding portions 32) connected to the opposite ends of the base portion 31 in the first direction x. Making the pair of bonding portions generally equal to each other in dimensions reduces the difference between the inductance of a part from the first obverse electrode 212 of the first semiconductor element 21 to the base portion 31 and the inductance of a part from the second obverse electrode 222 of the second semiconductor element 22 to the base portion 31. This reduces unevenness in power loss between the paths from the output terminal 43 to the first semiconductor element 21 and to the second semiconductor element 22.

The conductive member 30 makes it possible to shorten the length of the conduction path between the first obverse electrode 212 of the first semiconductor element 21 and the second obverse electrode 222 of the second semiconductor element 22, as compared with a conventional configuration. Thus, the inductance and parasitic resistance associated with the conductive member 30 can be reduced.

The semiconductor device A10 further includes a sealing resin 60 covering the conductive member 30. The sealing resin 60 includes a part held between the exposed portion 11A of the substrate 11 and the base portion 31 of the conductive member 30 in the thickness direction z. Such a configuration allows stable retainment of the conductive member 30 by the sealing resin 60 and reduction in the parasitic resistance of the semiconductor device A10 associated with the conductive member 30 and the substrate 11.

The semiconductor device A10 further includes the capacitor 24 bonded to the first wiring layer 12 and the second wiring layer 13. Thus, a snubber circuit to reduce the surge voltage applied to the first input terminal 41 and the second input terminal 42 is formed in the semiconductor device A10. Thus, the first semiconductor element 21 and the second semiconductor element 22 can be protected against the surge voltage. Since the capacitor 24 is disposed to overlap with the exposed portion 11A of the substrate 11 as viewed in the thickness direction z, an increase in size of the semiconductor device A10 can be avoided.

The thickness of each of the first wiring layer 12 and the second wiring layer 13 is larger than that of the substrate 11. Such a configuration improves the heat conduction efficiency in a direction orthogonal to the thickness direction z in each of the first wiring layer 12 and the second wiring layer 13. This contributes to improved heat dissipation of the semiconductor device A10.

A semiconductor device A20 according to a second embodiment of the present disclosure is disclosed below with reference to FIGS. 15 to 18. In these figures, the elements that are identical or similar to those of the semiconductor device A10 described above are denoted by the same reference signs, and the descriptions thereof are omitted. For easier understanding, the sealing resin 60 is illustrated as transparent in FIG. 15.

The semiconductor device A20 differs from the semiconductor device A10 in configurations of the first semiconductor element 21, the second semiconductor element 22, the pair of gate wires 51 and the pair of detection wires 52 and in that it includes a first gate-electrode lead-out layer 161 instead of the second gate-electrode lead-out layer 162.

Figure 15:
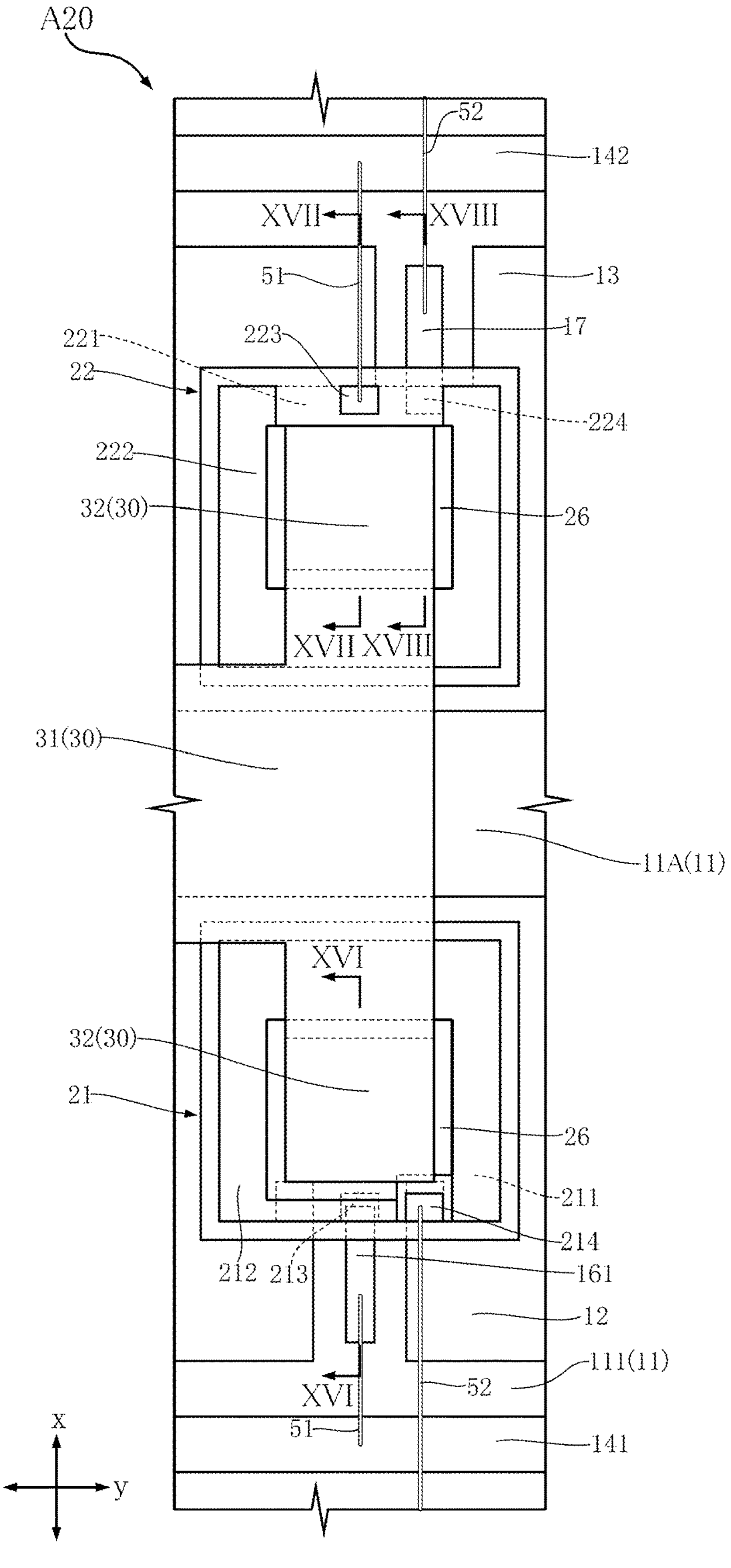
FIG. 15 is an enlarged plan view showing a part of a semiconductor device according to a second embodiment, as seen through a sealing resin.
Figure 16:
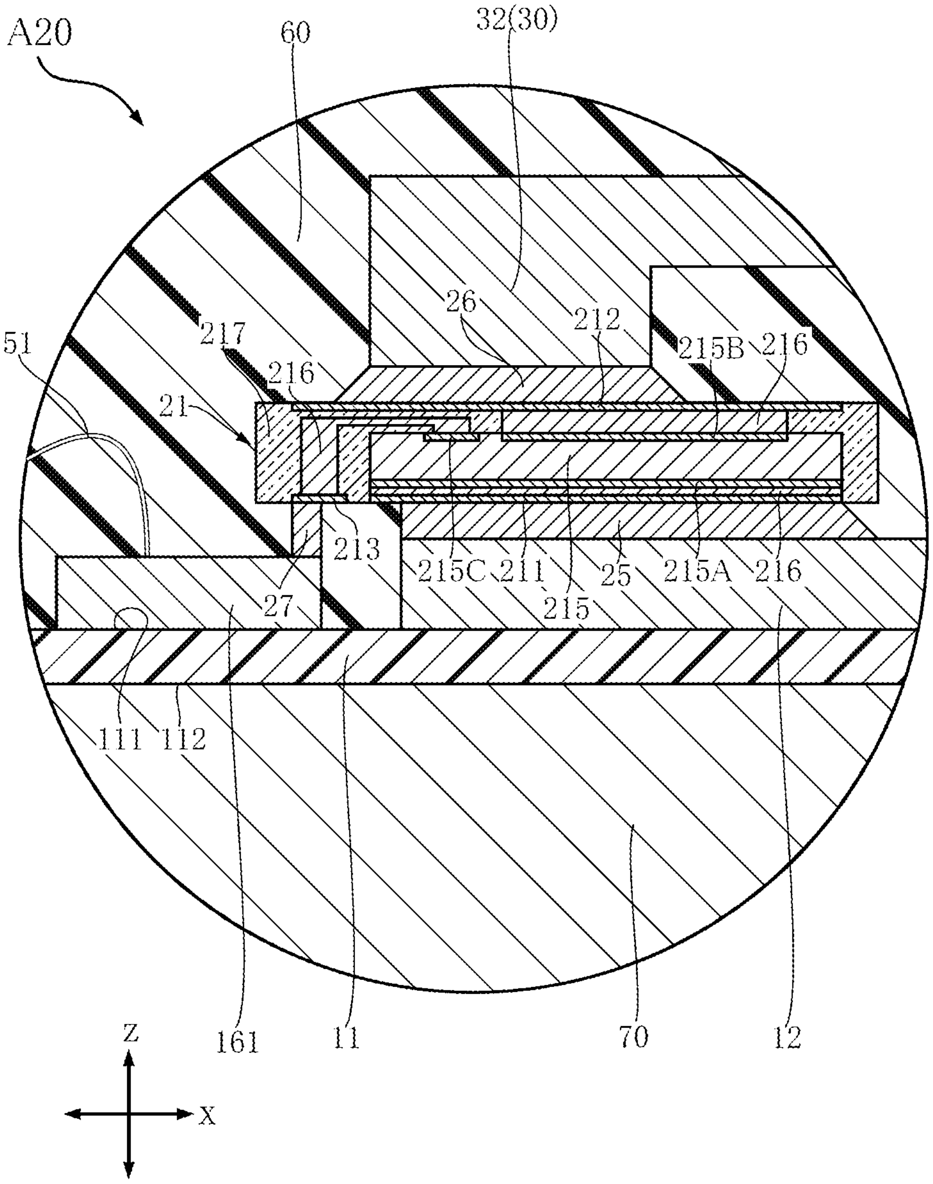
FIG. 16 is a sectional view taken along line XVI-XVI in FIG. 15.

As shown in FIGS. 15 and 16, the first semiconductor element 21 further includes a first detection electrode 214, a first element body 215, a plurality of first re-distribution layers 216, and a first protective layer 217. The first element body 215 is a transistor of the same type as the first semiconductor element 21 of the semiconductor device A10 and has the same configuration as the first semiconductor element 21. The first element body 215 has a first electrode 215A, a second electrode 215B, and a gate electrode 215C. The first electrode 215A corresponds to the first reverse electrode 211, i.e., the drain electrode of the first semiconductor element 21 of the semiconductor device A10. The second electrode 215B corresponds to the first obverse electrode 212, i.e., the source electrode of the first semiconductor element 21 of the semiconductor device A10. The gate electrode 215C corresponds to the first gate electrode 213 of the first semiconductor element 21 of the semiconductor device A10.

As shown in FIG. 16, the first re-distribution layers 216 form a conduction path connecting the first electrode 215A, the second electrode 215B and the gate electrode 215C to the first reverse electrode 211, the first obverse electrode 212, the first gate electrode 213 and the first detection electrode 214. The first re-distribution layers 216 electrically connect the first electrode 215A to the first reverse electrode 211. The second electrode 215B is electrically connected to the first obverse electrode 212 and the first detection electrode 214. The gate electrode 215C is electrically connected to the first gate electrode 213. In the semiconductor device A20, the first gate electrode 213 is located on the same side as the first reverse electrode 211 in the thickness direction z. As viewed in the thickness direction z, the first gate electrode 213 is located outside the first element body 215. As viewed in the thickness direction z, the area of the first obverse electrode 212 is larger than that of the second electrode 215B.

As shown in FIG. 15, the first detection electrode 214 is located on the same side as the first obverse electrode 212 in the thickness direction z. A voltage of the same potential as the first obverse electrode 212 is applied to the first detection electrode 214.

As shown in FIG. 16, the first protective layer 217 covers the first element body 215 and the first re-distribution layers 216. The first reverse electrode 211, the first obverse electrode 212, the first gate electrode 213, and the first detection electrode 214 are exposed from the first protective layer 217. The first protective layer 217 is made of a material containing polyimide, for example.

As shown in FIGS. 15, the first gate-electrode lead-out layer 161 is disposed on the obverse surface 111 of the substrate 11. As viewed in the thickness direction z, the first semiconductor element 21 overlaps with the first gate-electrode lead-out layer 161. The first gate-electrode lead-out layer 161 is electrically connected to the first gate wiring layer 141. The first gate-electrode lead-out layer 161 is elongated in the first direction x. The first gate-electrode lead-out layer 161 is made of a material containing copper or a copper alloy. As shown in FIG. 16, the first gate electrode 213 of the first semiconductor element 21 is bonded to the first gate-electrode lead-out layer 161 with the third bonding layer 27. Thus, the first gate electrode 213 is electrically connected to the first gate-electrode lead-out layer 161.

Figure 17:
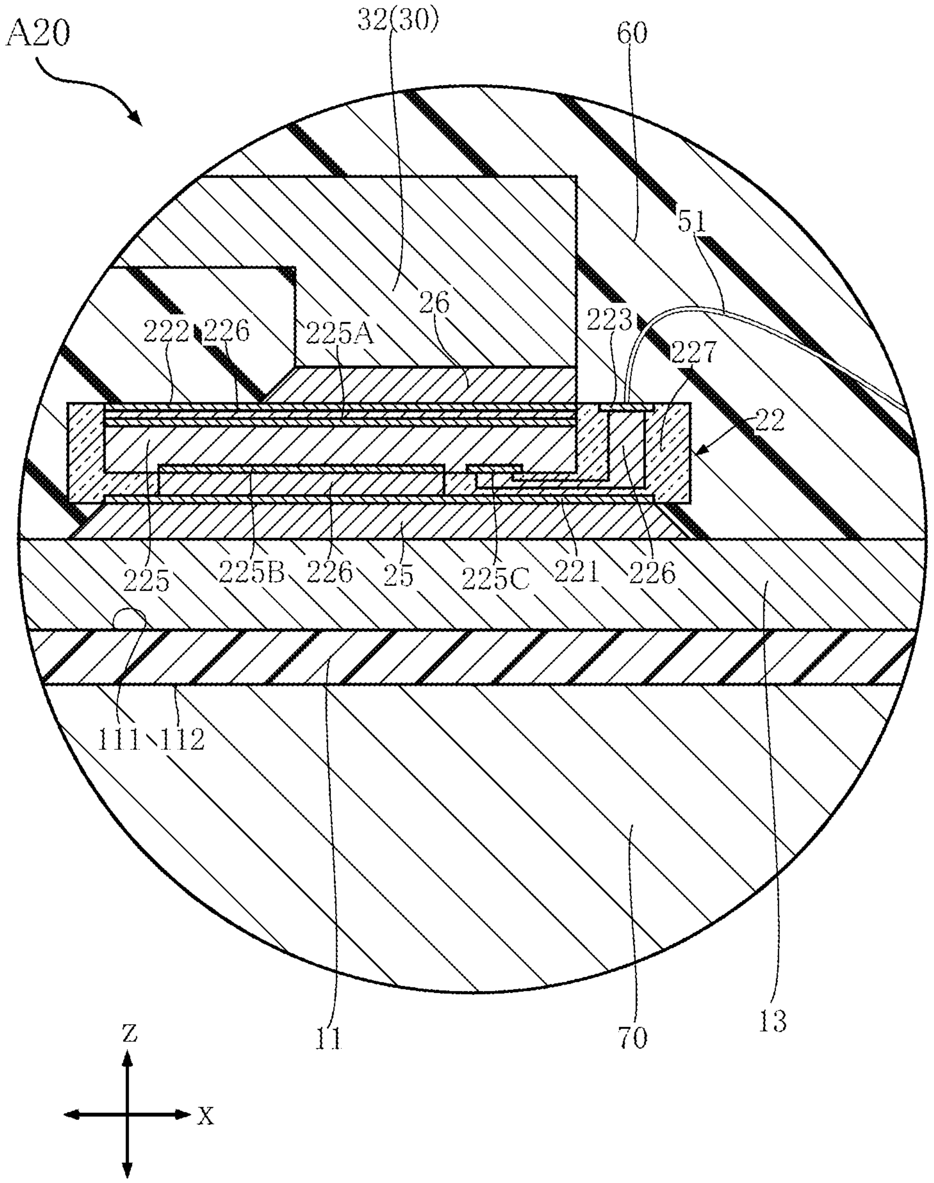
FIG. 17 is a sectional view taken along line XVII-XVII in FIG. 15.
Figure 18:
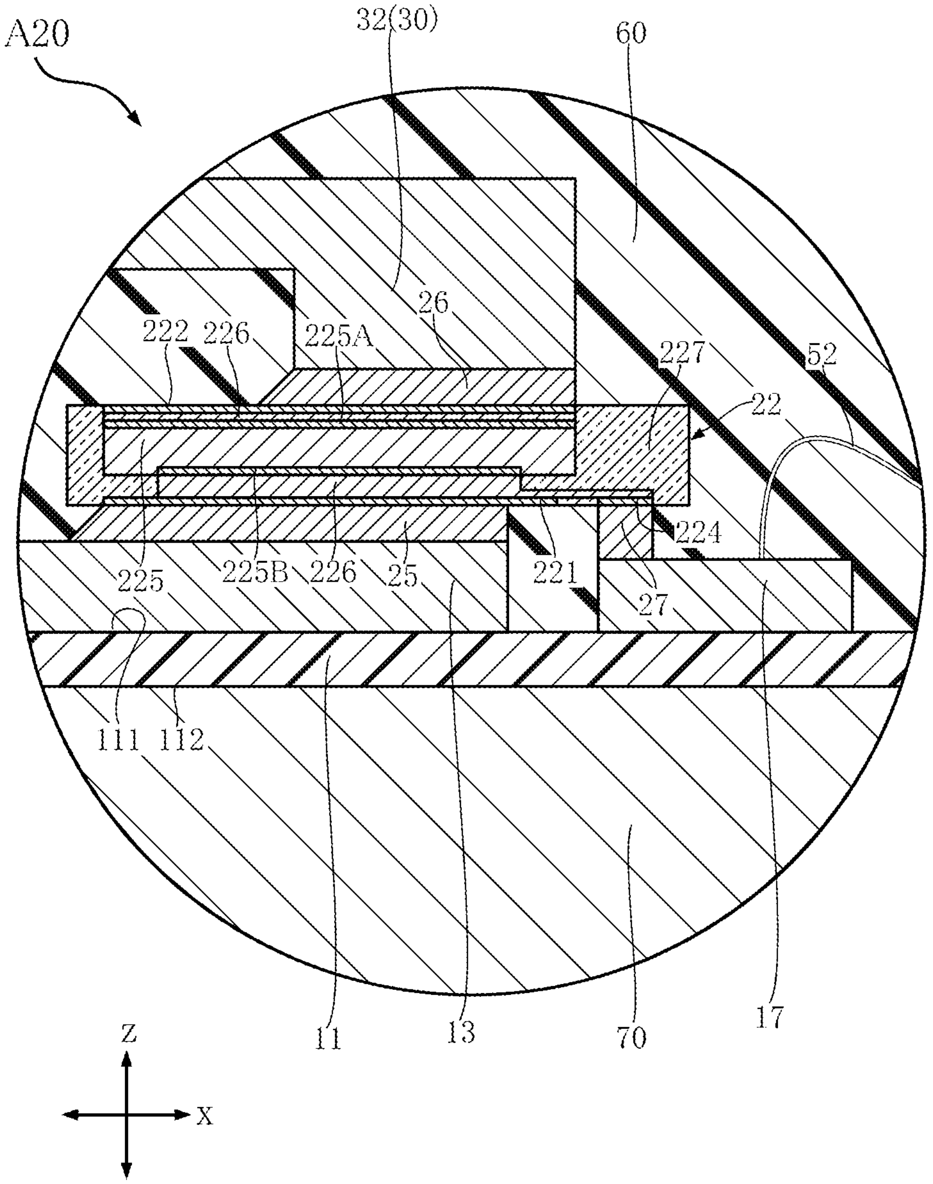
FIG. 18 is a sectional view taken along line XVIII-XVIII in FIG. 15.

As shown in FIGS. 15, 17 and 18, the second semiconductor element 22 further includes a second detection electrode 224, a second element body 225, a plurality of second re-distribution layers 226, and a second protective layer 227. The second element body 225 is a transistor of the same type as the second semiconductor element 22 of the semiconductor device A10 and has the same configuration as the second semiconductor element 22. The second element body 225 has a first electrode 225A, a second electrode 225B, and a gate electrode 225C. The first electrode 225A corresponds to the second obverse electrode 222, i.e., the drain electrode of the second semiconductor element 22 of the semiconductor device A10. The second electrode 225B corresponds to the second reverse electrode 221, i.e., the source electrode of the second semiconductor element 22 of the semiconductor device A10. The gate electrode 225C corresponds to the second gate electrode 223 of the second semiconductor element 22 of the semiconductor device A10.

As shown in FIGS. 17 and 18, the second re-distribution layers 226 form a conduction path connecting the first electrode 225A, the second electrode 225B and the gate electrode 225C to the second reverse electrode 221, the second obverse electrode 222, the second gate electrode 223 and the second detection electrode 224. The second re-distribution layers 226 electrically connect the first electrode 225A to the second obverse electrode 222. The second electrode 225B is electrically connected to the second reverse electrode 221 and the second detection electrode 224. The gate electrode 225C is electrically connected to the second gate electrode 223. In the semiconductor device A20, the second gate electrode 223 is located on the same side as the second obverse electrode 222 in the thickness direction z. As viewed in the thickness direction z, the second gate electrode 223 is located outside the second element body 225. As viewed in the thickness direction z, the area of the second reverse electrode 221 is larger than that of the second electrode 225B.

As shown in FIGS. 15 and 18, the second detection electrode 224 is located on the same side as the second reverse electrode 221 in the thickness direction z. A voltage of the same potential as the second reverse electrode 221 is applied to the second detection electrode 224. As shown in FIG. 18, the second detection electrode 224 is bonded to the reverse electrode lead-out layer 17 with the third bonding layer 27. Thus, the second detection electrode 224 is electrically connected to the reverse electrode lead-out layer 17.

As shown in FIGS. 17 and 18, the second protective layer 227 covers the second element body 225 and the second re-distribution layers 226. The second reverse electrode 221, the second obverse electrode 222, the second gate electrode 223, and the second detection electrode 224 are exposed from the second protective layer 227. The second protective layer 227 is made of a material containing polyimide, for example.

As shown in FIG. 15, one gate wire 51 of the pair of gate wires 51 is bonded to the first gate-electrode lead-out layer 161 and the first gate wiring layer 141. Thus, the first gate electrode 213 of the first semiconductor element 21 is electrically connected to the first gate terminal 441. As shown in FIG. 15, the other gate wire 51 of the pair of gate wires 51 is bonded to the second gate electrode 223 of the second semiconductor element 22 and the second gate wiring layer 142. Thus, the second gate electrode 223 is electrically connected to the second gate terminal 442.

As shown in FIG. 15, one detection wire 52 of the pair of detection wires 52 is bonded to the first detection electrode 214 of the first semiconductor element 21 and the first detection wiring layer 151. Thus, the first obverse electrode 212 of the first semiconductor element 21 is electrically connected to the first detection terminal 451. As shown in FIG. 15, the other detection wire 52 of the pair of detection wires 52 is bonded to the reverse electrode lead-out layer 17 and the second detection wiring layer 152. Thus, the second reverse electrode 221 of the second semiconductor element 22 is electrically connected to the second detection terminal 452.

The advantages of the semiconductor device A20 are described below.

The semiconductor device A20 includes a conductive member 30 spaced apart from the substrate 11 in the sense of the thickness direction z which the obverse surface 111 faces. The conductive member 30 is bonded to the first obverse electrode 212 of the first semiconductor element 21 and the second obverse electrode 222 of the second semiconductor element 22. Polarities of the first obverse electrode 212 and the second obverse electrode 222 are different from each other. The substrate 11 has an exposed portion 11A located between the first wiring layer 12 and the second wiring layer 13 as viewed in the thickness direction z. As viewed in the thickness direction z, the conductive member 30 overlaps with the exposed portion 11A. Thus, the semiconductor device A20 can also reduce noise due to leakage current from the device.

In the semiconductor device A20, the second gate electrode 223 of the second semiconductor element 22 is located on the same side as the second obverse electrode 222 in the thickness direction z. This eliminates the need for disposing the second gate-electrode lead-out layer 162.

In the semiconductor device A20, the first semiconductor element 21 has the first element body 215 and the plurality of first re-distribution layers 216. This allows increasing the area of the first obverse electrode 212 of the first semiconductor element 21 as viewed in the thickness direction z. Such an increased area contributes to increased bonding strength of the conductive member 30 to the first obverse electrode 212 and improved heat conduction efficiency from the first obverse electrode 212 to the conductive member 30.

In the semiconductor device A20, the second semiconductor element 22 has the second element body 225 and the second re-distribution layer 226. This allows increasing the area of the of the second reverse electrode 221 of the second semiconductor element 22 as viewed in the thickness direction z. Such an increased area contributes to increased bonding strength of the second reverse electrode 221 to the second wiring layer 13 and improved heat conduction efficiency from the second reverse electrode 221 to the second wiring layer 13.

A semiconductor device A30 according to a third embodiment of the present disclosure is disclosed below with reference to FIG. 19. In these figures, the elements that are identical or similar to those of the semiconductor device A10 described above are denoted by the same reference signs, and the descriptions thereof are omitted. For easier understanding, the sealing resin 60 is illustrated as transparent in FIG. 19.

The semiconductor device A30 differs from the semiconductor device A10 in configuration of the second semiconductor element 22.

Figure 19:
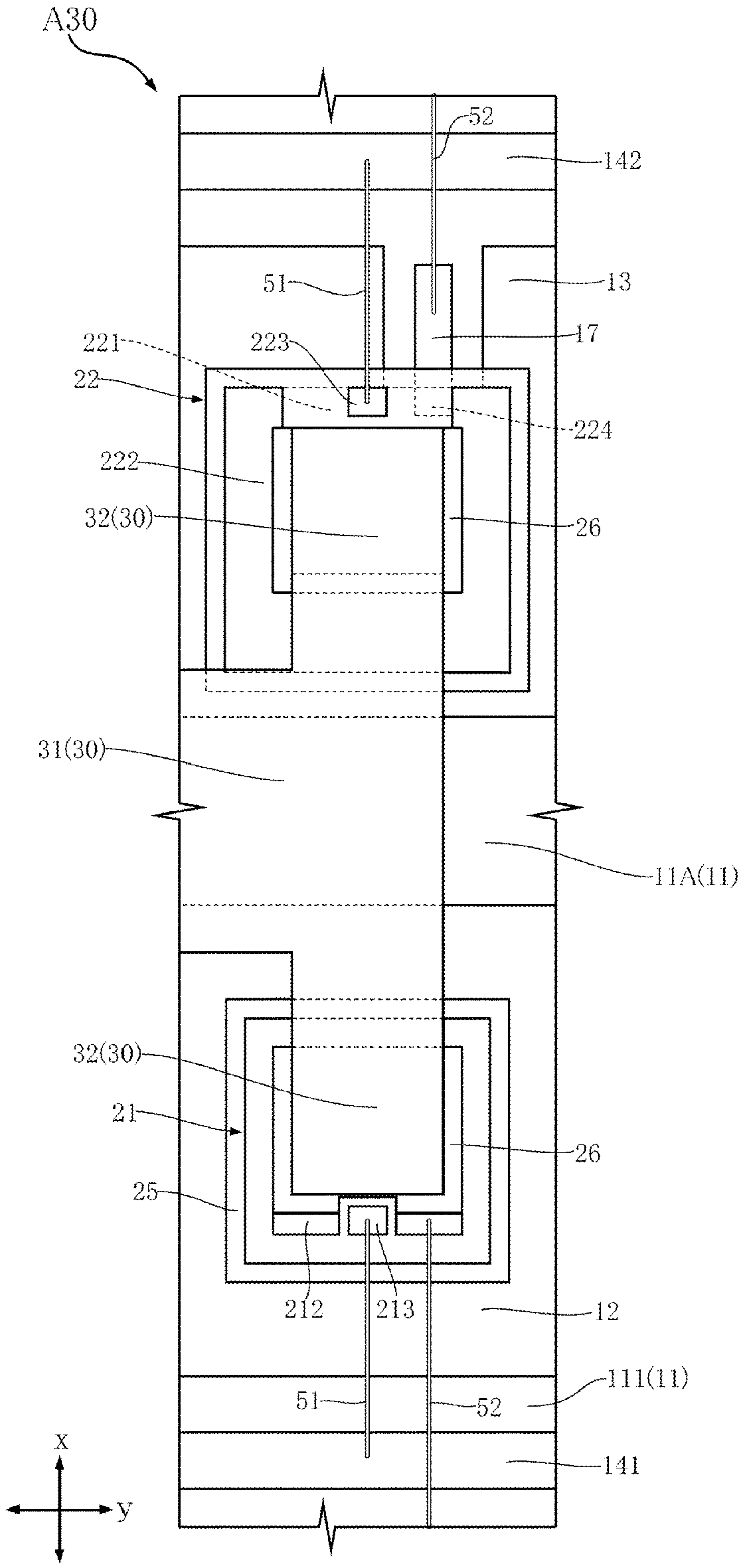
FIG. 19 is an enlarged plan view showing a part of a semiconductor device according to a third embodiment, as seen through a sealing resin.

As shown in FIG. 19, the configuration of the first semiconductor element 21 is the same as that of the first semiconductor element 21 of the semiconductor device A10. Thus, in the semiconductor device A30, the first gate electrode 213 of the first semiconductor element 21 is located on the same side as the first obverse electrode 212 in the thickness direction z.

As shown in FIG. 19, the configuration of the second semiconductor element 22 is the same as that of the second semiconductor element 22 of the semiconductor device A20. Thus, in the semiconductor device A30, the second gate electrode 223 of the second semiconductor element 22 is located on the same side as the second obverse electrode 222 in the thickness direction z.

The advantages of the semiconductor device A30 are described below.

The semiconductor device A30 includes a conductive member 30 spaced apart from the substrate 11 in the sense of the thickness direction z which the obverse surface 111 faces. The conductive member 30 is bonded to the first obverse electrode 212 of the first semiconductor element 21 and the second obverse electrode 222 of the second semiconductor element 22. Polarities of the first obverse electrode 212 and the second obverse electrode 222 are different from each other. The substrate 11 has an exposed portion 11A located between the first wiring layer 12 and the second wiring layer 13 as viewed in the thickness direction z. As viewed in the thickness direction z, the conductive member 30 overlaps with the exposed portion 11A. Thus, the semiconductor device A30 can also reduce noise due to leakage current from the device.

In the semiconductor device A30, the first gate electrode 213 of the first semiconductor element 21 is located on the same side as the first obverse electrode 212 in the thickness direction z. This eliminates the need for disposing the first gate-electrode lead-out layer 161. Moreover, in the semiconductor device A30, the second gate electrode 223 of the second semiconductor element 22 is located on the same side as the second obverse electrode 222 in the thickness direction z. This eliminates the need for disposing the second gate-electrode lead-out layer 162.

A semiconductor device A40 according to a fourth embodiment of the present disclosure is disclosed below with reference to FIG. 20. In these figures, the elements that are identical or similar to those of the semiconductor device A10 described above are denoted by the same reference signs, and the descriptions thereof are omitted. For easier understanding, the sealing resin 60 is illustrated as transparent in FIG. 20.

The semiconductor device A40 differs from the semiconductor device A10 in configuration of the first semiconductor element 21.

Figure 20:
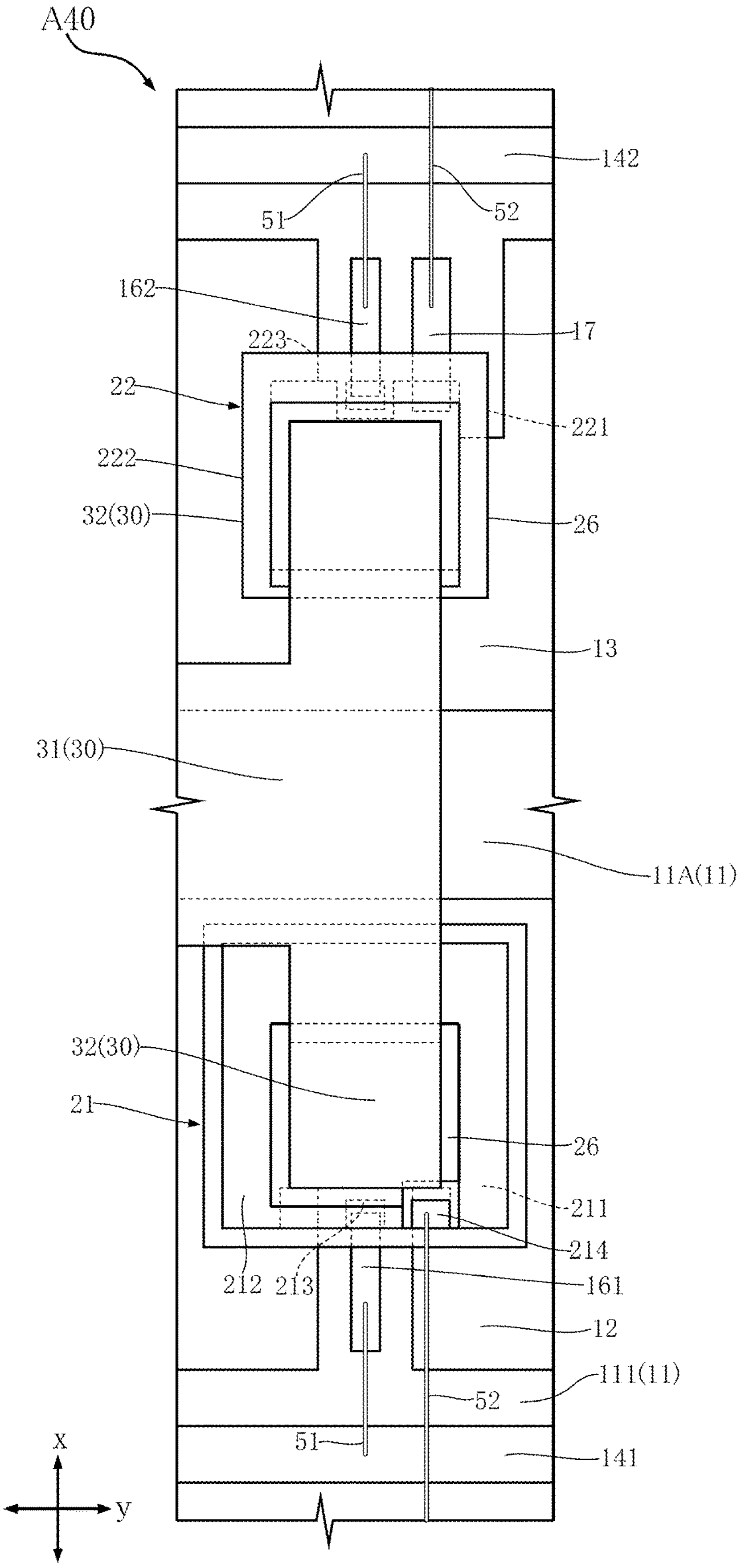
FIG. 20 is an enlarged plan view showing a part of a semiconductor device according to a fourth embodiment, as seen through a sealing resin.

As shown in FIG. 20, the configuration of the first semiconductor element 21 is the same as that of the first semiconductor element 21 of the semiconductor device A20. Thus, in the semiconductor device A40, the first gate electrode 213 of the first semiconductor element 21 is located on the same side as the first reverse electrode 211 in the thickness direction z. Thus, in the semiconductor device A40, placement of the first gate-electrode lead-out layer 161 is indispensable.

As shown in FIG. 20, the configuration of the second semiconductor element 22 is the same as that of the second semiconductor element 22 of the semiconductor device A10. Thus, in the semiconductor device A40, the second gate electrode 223 of the second semiconductor element 22 is located on the same side as the second reverse electrode 221 in the thickness direction z. Thus, in the semiconductor device A40, placement of the second gate-electrode lead-out layer 162 is indispensable.

The advantages of the semiconductor device A40 are described below.

The semiconductor device A40 includes a conductive member 30 spaced apart from the substrate 11 in the sense of the thickness direction z which the obverse surface 111 faces. The conductive member 30 is bonded to the first obverse electrode 212 of the first semiconductor element 21 and the second obverse electrode 222 of the second semiconductor element 22. Polarities of the first obverse electrode 212 and the second obverse electrode 222 are different from each other. The substrate 11 has an exposed portion 11A located between the first wiring layer 12 and the second wiring layer 13 as viewed in the thickness direction z. As viewed in the thickness direction z, the conductive member 30 overlaps with the exposed portion 11A. Thus, the semiconductor device A40 can also reduce noise due to leakage current from the device.

A semiconductor device A50 according to a fifth embodiment of the present disclosure is disclosed below with reference to FIGS. 21 to 23. In these figures, the elements that are identical or similar to those of the semiconductor device A10 described above are denoted by the same reference signs, and the descriptions thereof are omitted. For easier understanding, the sealing resin 60 is illustrated as transparent in FIG. 21.

The semiconductor device A50 differs from the semiconductor device A10 in configuration of the second semiconductor element 22 and those of the gate wire 51 and the detection wire 52 which are bonded to the second semiconductor element 22.

Figure 21:
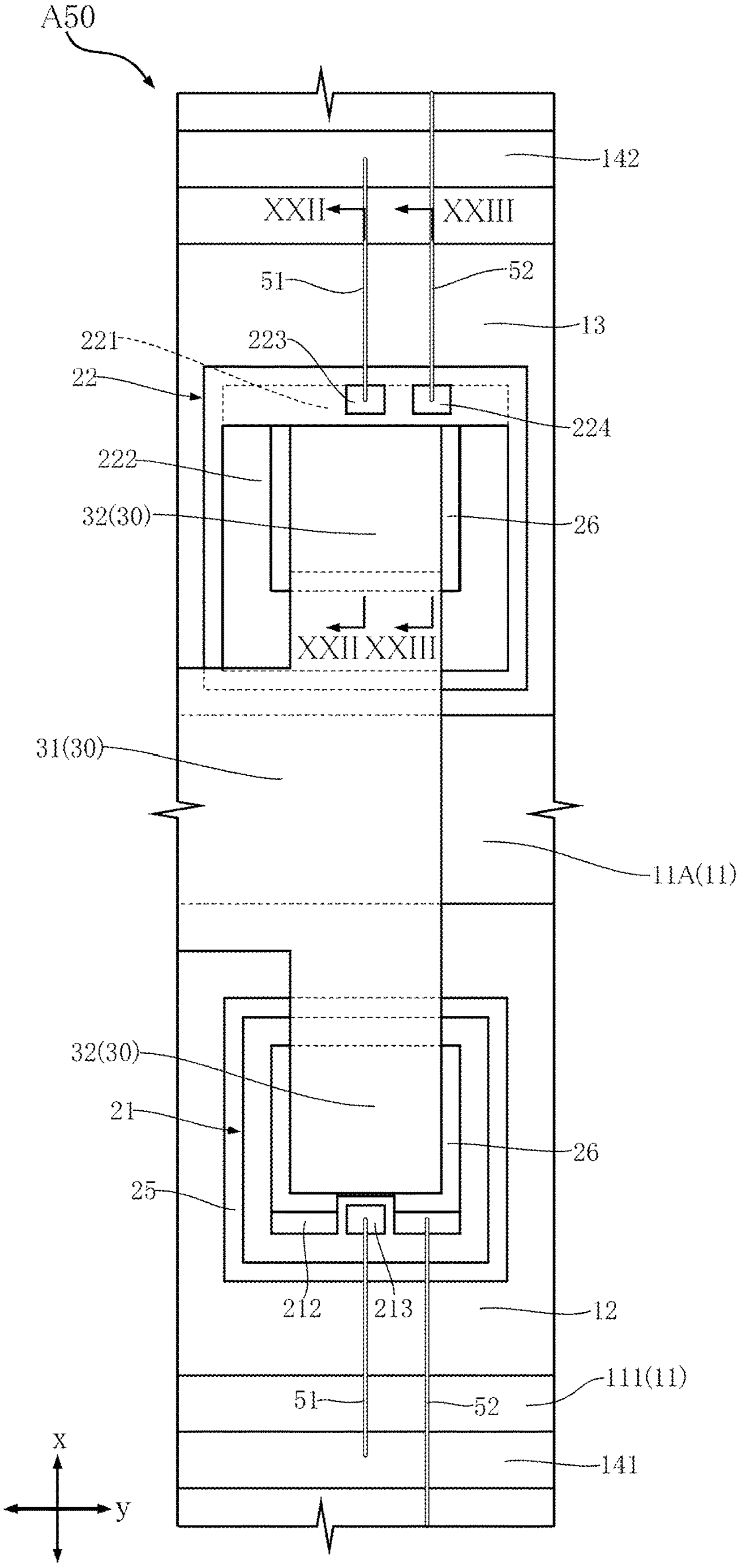
FIG. 21 is an enlarged plan view showing a part of a semiconductor device according to a fifth embodiment, as seen through a sealing resin.

As shown in FIG. 21, the configuration of the first semiconductor element 21 is the same as that of the first semiconductor element 21 of the semiconductor device A10. Thus, in the semiconductor device A30, the first gate electrode 213 of the first semiconductor element 21 is located on the same side as the first obverse electrode 212 in the thickness direction z.

Figure 22:
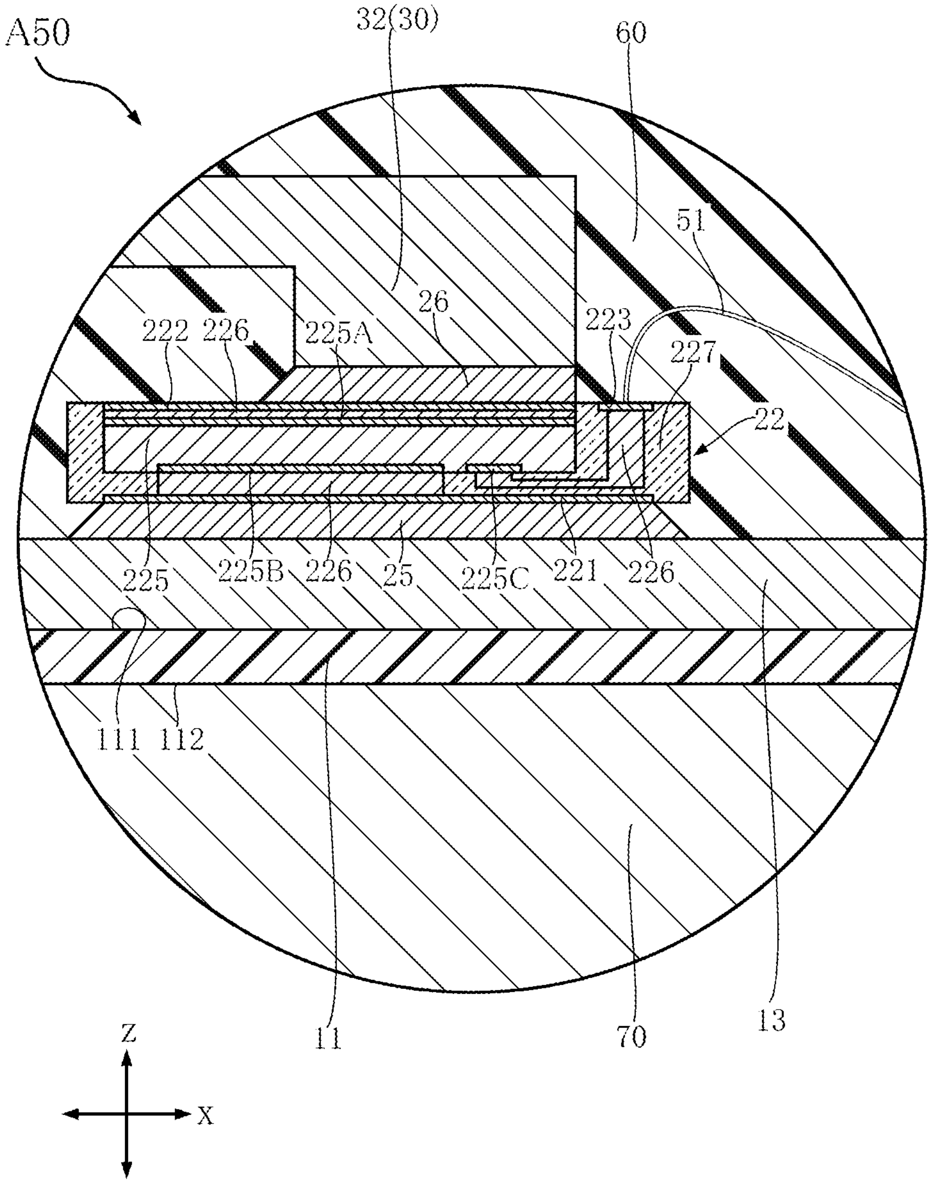
FIG. 22 is a sectional view taken along line XXII-XXII in FIG. 21.
Figure 23:
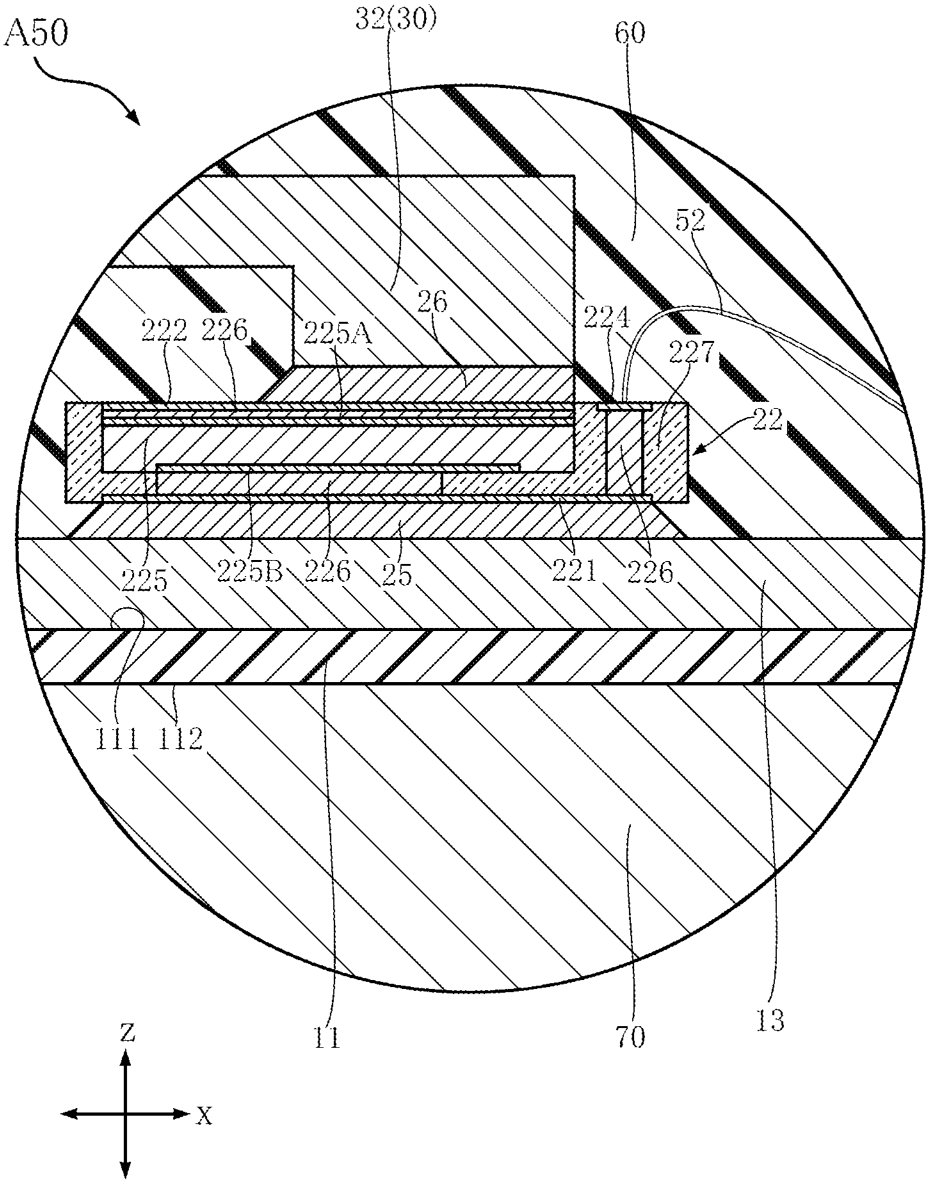
FIG. 23 is a sectional view taken along line XXIII-XXIII in FIG. 21.

As shown in FIGS. 21 to 23, the second semiconductor element 22 further includes a second detection electrode 224, a second element body 225, a plurality of second re-distribution layers 226, and a second protective layer 227.

As shown in FIGS. 21 to 23, in the semiconductor device A50, the second gate electrode 223 and the second detection electrode 224 are located on the same side as the second obverse electrode 222 in the thickness direction z. As viewed in the thickness direction z, the second gate electrode 223 and the second detection electrode 224 are located outside the second element body 225. As viewed in the thickness direction z, the area of the second reverse electrode 221 is larger than that of the second electrode 225B.

As shown in FIG. 21, one gate wire 51 of the pair of gate wires 51 is bonded to the first gate electrode 213 of the first semiconductor element 21 and the first gate wiring layer 141. Thus, the first gate electrode 213 is electrically connected to the first gate terminal 441. As shown in FIG. 21, the other gate wire 51 of the pair of gate wires 51 is bonded to the second gate electrode 223 of the second semiconductor element 22 and the second gate wiring layer 142. Thus, the second gate electrode 223 is electrically connected to the second gate terminal 442.

As shown in FIG. 21, one detection wire 52 of the pair of detection wires 52 is bonded to the first obverse electrode 212 of the first semiconductor element 21 and the first detection wiring layer 151. Thus, the first obverse electrode 212 is electrically connected to the first detection terminal 451. As shown in FIG. 21, the other detection wire 52 of the pair of detection wires 52 is bonded to the second detection electrode 224 of the second semiconductor element 22 and the second detection wiring layer 152. Thus, the second reverse electrode 221 of the second semiconductor element 22 is electrically connected to the second detection terminal 452.

The advantages of the semiconductor device A50 are described below.

The semiconductor device A50 includes a conductive member 30 spaced apart from the substrate 11 in the sense of the thickness direction z which the obverse surface 111 faces. The conductive member 30 is bonded to the first obverse electrode 212 of the first semiconductor element 21 and the second obverse electrode 222 of the second semiconductor element 22. Polarities of the first obverse electrode 212 and the second obverse electrode 222 are different from each other. The substrate 11 has an exposed portion 11A located between the first wiring layer 12 and the second wiring layer 13 as viewed in the thickness direction z. As viewed in the thickness direction z, the conductive member 30 overlaps with the exposed portion 11A. Thus, the semiconductor device A50 can also reduce noise due to leakage current from the device.

In the semiconductor device A50, the second gate electrode 223 of the second semiconductor element 22 is located on the same side as the second obverse electrode 222 in the thickness direction z. This eliminates the need for disposing the second gate-electrode lead-out layer 162. In the semiconductor device A50, the second semiconductor element 22 has the second detection electrode 224 located on the same side as the second obverse electrode 222 in the thickness direction z. The second detection electrode 224 is electrically connected to the second reverse electrode 221 of the second semiconductor element 22. This eliminates the need for disposing the reverse electrode lead-out layer 17.

The present disclosure is not limited to the foregoing embodiments. The specific configuration of each part of the present disclosure can be varied in design in many ways.

The present disclosure includes the embodiments described in the following clauses.

Clause 1.

A semiconductor device comprising:

a substrate having an obverse surface facing in a thickness direction;

a first wiring layer disposed on the obverse surface;

a second wiring layer disposed on the obverse surface and spaced apart from the first wiring layer in a first direction orthogonal to the thickness direction;

a first semiconductor element having a first obverse electrode and a first reverse electrode located opposite to each other in the thickness direction, the first reverse electrode being bonded to the first wiring layer;

a second semiconductor element having a second obverse electrode and a second reverse electrode located opposite to each other in the thickness direction, the second reverse electrode being bonded to the second wiring layer; and a conductive member spaced apart from the substrate in the thickness direction and bonded to the first obverse electrode and the second obverse electrode, wherein polarities of the first obverse electrode and the second obverse electrode are different from each other, the substrate includes an exposed portion located between the first wiring layer and the second wiring layer, and the conductive member overlaps with the exposed portion, as viewed in the thickness direction.

Clause 2.

The semiconductor device according to clause 1, further comprising:

a first gate terminal spaced apart from the first wiring layer; and a second gate terminal spaced apart from the second wiring layer, wherein the first semiconductor element has a first gate electrode electrically connected to the first gate terminal, and the second semiconductor element has a second gate electrode electrically connected to the second gate terminal.

Clause 3.

The semiconductor device according to clause 2, further comprising:

a first detection terminal spaced apart from the first wiring layer and electrically connected to the first obverse electrode, and a second detection terminal spaced apart from the second wiring layer and electrically connected to the second reverse electrode.

Clause 4.

The semiconductor device according to clause 3, further comprising a gate electrode lead-out layer spaced apart from the second wiring layer and electrically connected to the second gate terminal, wherein the first gate electrode is located on a same side as the first obverse electrode in the thickness direction, and the second gate electrode is located on a same side as the second reverse electrode in the thickness direction and bonded to the gate electrode lead-out layer.

Clause 5.

The semiconductor device according to clause 3, wherein the first gate electrode is located on a same side as the first obverse electrode in the thickness direction, and the second gate electrode is located on a same side as the second obverse electrode in the thickness direction.

Clause 6.

The semiconductor device according to clause 5, wherein the second semiconductor element has a detection electrode located on the same side as the second obverse electrode in the thickness direction, and the detection electrode is electrically connected to the second reverse electrode and the second detection terminal.

Clause 7.

The semiconductor device according to clause 3, further comprising:

a first gate-electrode lead-out layer spaced apart from the first wiring layer and electrically connected to the first gate terminal, and a second gate-electrode lead-out layer spaced apart from the second wiring layer and electrically connected to the second gate terminal, wherein the first gate electrode is located on a same side as the first reverse electrode in the thickness direction and bonded to the first gate-electrode lead-out layer, and the second gate electrode is located on a same side as the second reverse electrode in the thickness direction and bonded to the second gate-electrode lead-out layer.

Clause 8.

The semiconductor device according to any one of clauses 3 to 7, further comprising a pair of diodes bonded to the first wiring layer and the second wiring layer, respectively, wherein the pair of diodes are bonded to the conductive member.

Clause 9.

The semiconductor device according to any one of clauses 3 to 8, further comprising a capacitor bonded to the first wiring layer and the second wiring layer.

Clause 10.

The semiconductor device according to clause 9, wherein the capacitor overlaps with the exposed portion, as viewed in the thickness direction.

Clause 11.

The semiconductor device according to any one of clauses 3 to 10, further comprising:

a first input terminal electrically connected to the first wiring layer;

a second input terminal electrically connected to the second wiring layer; and an output terminal spaced apart from the substrate in a sense of the thickness direction which the obverse surface faces and electrically connected to the conductive member, wherein the first input terminal and the second input terminal are located on a first side of the substrate in a second direction orthogonal to the thickness direction and the first direction, and the output terminal is located on a second side of the substrate in the second direction.

Clause 12.

The semiconductor device according to clause 11, wherein the output terminal is bonded to the conductive member.

Clause 13.

The semiconductor device according to any one of clauses 3 to 12, wherein the first gate terminal is located on an opposite side of the second wiring layer with respect to the first wiring layer in the first direction, and the second gate terminal is located on an opposite side of the first wiring layer with respect to the second wiring layer in the first direction.

Clause 14.

The semiconductor device according to clause 13, wherein the first detection terminal is located closer to the first gate terminal than to the second gate terminal, and the second detection terminal is located closer to the second gate terminal than to the first gate terminal.

Clause 15.

The semiconductor device according to any one of clauses 1 to 14, further comprising a sealing resin covering the first wiring layer, the second wiring layer, the first semiconductor element, the second semiconductor element and the conductive member, wherein the sealing resin includes a part held between the exposed portion and the conductive member in the thickness direction.

Clause 16.

The semiconductor device according to clause 15, wherein the substrate has a reverse surface facing away from the obverse surface in the thickness direction, and the reverse surface is exposed from the sealing resin.

Clause 17.

The semiconductor device according to clause 16, further comprising a heat sink bonded to the reverse surface.

REFERENCE NUMERALS

A10, A20, A30, A40, A50: Semiconductor device

11: Substrate 11A: Exposed portion 111: Obverse surface

112: Reverse surface 12: First wiring layer

13: Second wiring layer 141: First gate wiring layer

142: Second gate wiring layer 151: First detection wiring layer

152: Second detection wiring layer

161: First gate electrode lead-out layer

162: Second gate-electrode lead-out layer

17: Reverse electrode lead-out layer

21: First semiconductor element 211: First reverse electrode

212: First obverse electrode 213: First gate electrode

214: First detection electrode 215: First element body

215A: First electrode 215B: Second electrode

215C: Gate electrode 216: First re-distribution layer

217: First protective layer 22: Second semiconductor element

221: Second reverse electrode 222: Second obverse electrode

223: Second gate electrode 224: Second detection electrode

225: Second element body 226: Second re-distribution layer

227: Second protective layer 23: Diode

23A: First diode 23B: Second diode

231: Anode electrode 232: Cathode electrode

24: Capacitor 241: Electrode

25: First bonding layer 26: Second bonding layer

27: Third bonding layer 30: Conductive member

31: Base portion 32: First bonding portion

33: Second bonding portion 41: First input terminal

411: First mounting hole 42: Second input terminal

421: Second mounting hole 43: Output terminal

431: Third mounting hole 441: First gate terminal

442: Second gate terminal 451: First detection terminal

452: Second detection terminal 51: Gate wire

52: Detection wire 53: First wire

54: Second wire 60: Sealing resin

61: Top surface 62: Bottom surface

63: First side surfaces 64: Second side surface z: Thickness direction x: First direction y: Second direction

The invention claimed is:

1. A semiconductor device comprising:

a substrate having an obverse surface facing in a thickness direction;

a first wiring layer disposed on the obverse surface;

a second wiring layer disposed on the obverse surface and spaced apart from the first wiring layer in a first direction orthogonal to the thickness direction;

a first semiconductor element having a first obverse electrode and a first reverse electrode located opposite to each other in the thickness direction, the first reverse electrode being bonded to the first wiring layer;

a second semiconductor element having a second obverse electrode and a second reverse electrode located opposite to each other in the thickness direction, the second reverse electrode being bonded to the second wiring layer;

a conductive member spaced apart from the substrate in the thickness direction and bonded to the first obverse electrode and the second obverse electrode;

a first gate terminal spaced apart from the first wiring layer;

a second gate terminal spaced apart from the second wiring layer;

a first gate electrode electrically connected to the first gate terminal;

a second gate electrode electrically connected to the second gate terminal;

a first detection terminal spaced apart from the first wiring layer and electrically connected to the first obverse electrode;

a second detection terminal spaced apart from the second wiring layer and electrically connected to the second reverse electrode; and a capacitor bonded to the first wiring layer and the second wiring layer, wherein polarities of the first obverse electrode and the second obverse electrode are different from each other, the substrate includes an exposed portion located between the first wiring layer and the second wiring layer, the conductive member overlaps with the exposed portion, as viewed in the thickness direction, and the capacitor overlaps with the exposed portion, as viewed in the thickness direction.

2. The semiconductor device according to claim 1, further comprising a gate electrode lead-out layer spaced apart from the second wiring layer and electrically connected to the second gate terminal, wherein the first gate electrode is located on a same side as the first obverse electrode in the thickness direction, and the second gate electrode is located on a same side as the second reverse electrode in the thickness direction and bonded to the gate electrode lead-out layer.

3. The semiconductor device according to claim 1, wherein the first gate electrode is located on a same side as the first obverse electrode in the thickness direction, and the second gate electrode is located on a same side as the second obverse electrode in the thickness direction.

4. The semiconductor device according to claim 3, wherein the second semiconductor element has a detection electrode located on the same side as the second obverse electrode in the thickness direction, and the detection electrode is electrically connected to the second reverse electrode and the second detection terminal.

5. The semiconductor device according to claim 1, further comprising:

a first gate-electrode lead-out layer spaced apart from the first wiring layer and electrically connected to the first gate terminal, and a second gate-electrode lead-out layer spaced apart from the second wiring layer and electrically connected to the second gate terminal, wherein the first gate electrode is located on a same side as the first reverse electrode in the thickness direction and bonded to the first gate-electrode lead-out layer, and the second gate electrode is located on a same side as the second reverse electrode in the thickness direction and bonded to the second gate-electrode lead-out layer.

6. The semiconductor device according to claim 1, further comprising a pair of diodes bonded to the first wiring layer and the second wiring layer, respectively, wherein the pair of diodes are bonded to the conductive member.

7. The semiconductor device according to claim 1, further comprising:

a first input terminal electrically connected to the first wiring layer;

a second input terminal electrically connected to the second wiring layer; and an output terminal spaced apart from the substrate in a sense of the thickness direction which the obverse surface faces and electrically connected to the conductive member, wherein the first input terminal and the second input terminal are located on a first side of the substrate in a second direction orthogonal to the thickness direction and the first direction, and the output terminal is located on a second side of the substrate in the second direction.

8. The semiconductor device according to claim 7, wherein the output terminal is bonded to the conductive member.

9. The semiconductor device according to claim 1, wherein the first gate terminal is located on an opposite side of the second wiring layer with respect to the first wiring layer in the first direction, and the second gate terminal is located on an opposite side of the first wiring layer with respect to the second wiring layer in the first direction.

10. The semiconductor device according to claim 9, wherein the first detection terminal is located closer to the first gate terminal than to the second gate terminal, and the second detection terminal is located closer to the second gate terminal than to the first gate terminal.

11. The semiconductor device according claim 1, further comprising a sealing resin covering the first wiring layer, the second wiring layer, the first semiconductor element, the second semiconductor element and the conductive member, wherein the sealing resin includes a part held between the exposed portion and the conductive member in the thickness direction.

12. The semiconductor device according to claim 11, wherein the substrate has a reverse surface facing away from the obverse surface in the thickness direction, and the reverse surface is exposed from the sealing resin.

13. The semiconductor device according to claim 12, further comprising a heat sink bonded to the reverse surface.

* * * * *